United States Patent
Peng et al.

(10) Patent No.: US 11,910,691 B2
(45) Date of Patent: Feb. 20, 2024

(54) DISPLAY PANEL, MANUFACTURING METHOD THEREOF, AND DISPLAY DEVICE

(71) Applicants: Yungu (Gu'an) Technology Co., Ltd., Langfang (CN); KunShan Go-Visionox Opto-Electronics Co., Ltd., Kunshan (CN)

(72) Inventors: ChaoChi Peng, Kunshan (CN); Mingxing Liu, Kunshan (CN); Shuaiyan Gan, Kunshan (CN)

(73) Assignees: Yungu (Gu'an) Technology Co., Ltd., Langfang (CN); KunShan Go-Visionox Opto-Electronics Co., Ltd., Kunshan (CN)

( * ) Notice: Subject to any disclaimer, the term of this patent is extended or adjusted under 35 U.S.C. 154(b) by 594 days.

(21) Appl. No.: 17/143,429

(22) Filed: Jan. 7, 2021

(65) Prior Publication Data
US 2021/0134899 A1    May 6, 2021

Related U.S. Application Data

(63) Continuation of application No. PCT/CN2019/098813, filed on Aug. 1, 2019.

(30) Foreign Application Priority Data

Dec. 28, 2018  (CN) .......................... 201811627712.0

(51) Int. Cl.
*H01L 23/00*     (2006.01)
*H10K 59/65*     (2023.01)
(Continued)

(52) U.S. Cl.
CPC ........... *H10K 59/65* (2023.02); *H10K 50/171* (2023.02); *H10K 50/816* (2023.02);
(Continued)

(58) Field of Classification Search
CPC . H10K 50/171; H10K 50/828; H10K 59/1216
See application file for complete search history.

(56) References Cited

FOREIGN PATENT DOCUMENTS

| CN | 201402347 Y | 2/2010 |
|----|-------------|--------|
| CN | 107425040 A | 12/2017 |
| CN | 107946341 A | 4/2018 |
| CN | 108022962 A | 5/2018 |

(Continued)

OTHER PUBLICATIONS

Office Action dated Jun. 17, 2020 in corresponding Taiwanese application No. 108129071; 14 pages including Machine-generated English-language translation.
(Continued)

*Primary Examiner* — Anthony Ho
(74) *Attorney, Agent, or Firm* — Maier & Maier, PLLC

(57) ABSTRACT

A display panel, a manufacturing method thereof, and a display device. The display panel includes a first display region and a second display region. The display panel further includes a base substrate, a driving circuit layer, a light emitting functional film layer and a conductive layer, which are located in the first display region and the second display region. The driving circuit layer is disposed on the base substrate; the light emitting functional film layer is disposed on the driving circuit layer; and the conductive layer is disposed on the light emitting functional film layer. A thickness of a portion of the conductive layer located in the first display region is less than a thickness of a portion of the conductive layer located in the second display region.

20 Claims, 12 Drawing Sheets

(51) Int. Cl.
    *H10K 50/17*     (2023.01)
    *H10K 50/816*     (2023.01)
    *H10K 50/828*     (2023.01)
    *H10K 59/127*     (2023.01)
    *H10K 59/131*     (2023.01)
    *H10K 59/121*     (2023.01)
    *H10K 71/00*     (2023.01)
    *H10K 77/10*     (2023.01)
    *G09G 3/3225*     (2016.01)
    *H10K 59/12*     (2023.01)
    *H10K 102/10*     (2023.01)
    *H10K 102/00*     (2023.01)

(52) U.S. Cl.
    CPC ......... *H10K 50/828* (2023.02); *H10K 59/127* (2023.02); *H10K 59/1216* (2023.02); *H10K 59/131* (2023.02); *H10K 71/00* (2023.02); *H10K 77/111* (2023.02); *G09G 3/3225* (2013.01); *H10K 59/1201* (2023.02); *H10K 2102/103* (2023.02); *H10K 2102/311* (2023.02); *H10K 2102/351* (2023.02)

(56) References Cited

FOREIGN PATENT DOCUMENTS

| | | |
|---|---|---|
| CN | 207517684 U | 6/2018 |
| CN | 108281556 A | 7/2018 |
| CN | 108376696 A | 8/2018 |
| CN | 108540613 A | 9/2018 |
| CN | 108810200 A | 11/2018 |
| JP | 2004333904 A | 11/2004 |
| JP | 2004335123 A | 11/2004 |
| JP | 2005182152 A | 7/2005 |

OTHER PUBLICATIONS

Office Action dated Sep. 29, 2019 in corresponding Chinese application No. 201920703006.3; 2 pages including Machine-generated English-language translation.

Office Action and Search Report dated Nov. 19, 2019 in corresponding Chinese application No. 201920703006.3; 2 pages including Machine-generated English-language translation.

International Search Report dated Nov. 6, 2019 in corresponding International application No. PCT/CN2019/098813; 4 pages.

Written Opinion of the International Searching Authority dated Nov. 6, 2019 in corresponding International application No. PCT/CN2019/098813; 4 pages.

DISPLAY PANEL, MANUFACTURING METHOD THEREOF, AND DISPLAY DEVICE

CROSS REFERENCE TO RELATED APPLICATIONS

This disclosure is a continuation application of International Patent Application No. PCT/CN2019/098813, filed on Aug. 1, 2019, which claims priority to Chinese Patent Application No. 201811627712.0 filed on Dec. 28, 2018, the contents of which is incorporated herein by reference.

FIELD

The present disclosure relates to the field of display technology, and more particularly, to a display panel, a manufacturing method thereof, and a display device.

BACKGROUND

With the rapid development of electronic devices, users have increasingly higher requirements on screen-to-body ratio, so that more and more attention is paid on the full-screen display of electronic devices in the industry. For an electronic device such as a mobile phone, a tablet computer, etc., a notch may be opened on the display screen for components to be integrated, such as a front camera, an earpiece, and an infrared sensor element, so as to mount the camera, the earpiece and the infrared sensor element in the notch area. However, the notch area of the screen, such as a notch screen, cannot be used to display images. Alternatively, the screen can be provided with an opening hole to mount a camera therein. For an electronic device with a photographing function, external light can enter a light sensing element disposed beneath the screen through the opening hole on the screen, which will produce poor imaging effect. Thus, such an electronic device is not full-screen, and the display is not performed in every area of the entire screen. For example, the camera area of the screen cannot display an image.

SUMMARY

According to a first aspect of embodiments of the present disclosure, there is provided a display panel having a first display area and a second display area. The display panel further includes a base substrate; a driving circuit layer formed on the base substrate; a light emitting functional film layer formed on the driving circuit layer; and a conductive layer formed on the light emitting functional film layer. The base substrate, the driving circuit layer, the light emitting functional layer and the conductive layer are located in the first display region and the second display region, and a thickness of a portion of the conductive layer located in the first display region is less than a thickness of a portion of the conductive layer located in the second display region.

According to a second aspect of the embodiments of the present disclosure, there is provided a display device, including: a device body including a component region; and the above display panel covering on the device body. The component region is located beneath the first display region, and the component region is provided with one or more light sensing elements which collect light through the first display region.

In the display device, since the thickness of the conductive layer located in the first display area is less than the thickness of the conductive layer located in the second display area of the display panel included in the display device, the light transmittance of the first display area can be greater than the light transmittance of the second display area, so that the one or more light sensing elements disposed below the first display area can receive enough light to ensure the one or more light sensing elements to operate properly.

According to a third aspect of the embodiments of the present disclosure, there is provided a method of manufacturing a display panel having a first display area and a second display area. The method includes: forming a base substrate; forming a driving circuit layer on the base substrate; forming a light emitting functional film layer on the driving circuit layer; and forming a conductive layer on the light emitting functional film layer, where a thickness of a portion of the conductive layer located in the first display region is less than a thickness of a portion of the conductive layer located in the second display region.

According to a fourth aspect of the embodiments of the present disclosure, there is provided an array substrate. The array substrate includes a transparent first OLED substrate and a non-transparent second OLED substrate. The first OLED substrate is at least partially surrounded by the second OLED substrate. The first OLED substrate and the second OLED substrate include a base substrate, a driving circuit layer formed on the base substrate, and a light emitting functional film layer formed on the driving circuit layer. The driving circuit layer of the first OLED substrate includes a plurality of first driving circuit units, each of which includes a storage capacitor and a first transistor. The storage capacitor includes a first electrode plate and a second electrode plate. The first driving circuit unit has a first conductive layer, a part of the first conductive layer serves as the first electrode plate, and another part serves as a gate electrode of the first transistor.

In the above array substrate, since a part of the first conductive layer of the first OLED substrate serves as the first electrode plate of the storage capacitor and another part serves as the gate electrode of the first transistor, the gate electrode of the first transistor, the first electrode plate of the storage capacitor as well as the connection therebetween can be completed in the same step, and there is no need to fabricate a connection structure between them, after the gate electrode of the first transistor and the first electrode plate of the storage capacitor are formed, thereby simplifying the manufacturing process flow of the first driving circuit unit.

According to a fifth aspect of the embodiments of the present disclosure, there is provided a display screen. The display screen includes the above array substrate and an encapsulation structure which is disposed on a side of the array substrate away from the base substrate.

In the above display screen, since a part of the first conductive layer of the first OLED substrate serves as the first electrode plate of the storage capacitor and another part serves as the gate electrode of the first transistor, the gate electrode of the first transistor, the first electrode plate of the storage capacitor, and the connection therebetween can be completed in the same step, and there is no need to fabricate a connection structure therebeween after forming the gate electrode of the first transistor and the first electrode plate of the storage capacitor, thereby simplifying the manufacturing process of the first driving circuit unit and further simplifying the manufacturing process of the driving circuit layer of the first OLED substrate.

According to a sixth aspect of the embodiments of the present disclosure, there is provided a display device, the display device including: a device body having a component region; the above-mentioned display screen covering the device body; where the component region is located below the first OLED substrate, and one or more light sensing elements that collect light through the first OLED substrate are disposed in the component area.

DETAILED DESCRIPTION

A display panel and a manufacturing method thereof according to the embodiments of the present disclosure will be described in detail hereinafter in connection with the accompanying figures. The features in the following embodiments and implementations can be complementary to or be combined with each other without conflict.

On smart electronic devices such as mobile phones and tablet computers, due to the requirement that light sensing elements such as a front camera and a light sensor are to be integrated, light sensing elements can be provided on a surface of a display panel of an electronic device which faces away from light in order to achieve a full-screen display. However, as light transmittance of the display panel is low, it is difficult for the light sensing elements provided on the surface of the display panel which faces away from light to receive enough light, which makes the light sensing elements operate improperly. For example, the camera provided on the surface of the display panel which faces away from light collects less light, and thus the captured images are of poor quality.

Such a kind of problem rises due to a great thickness of the film layers of the display panel, which results in low light transmittance.

Figure 1:
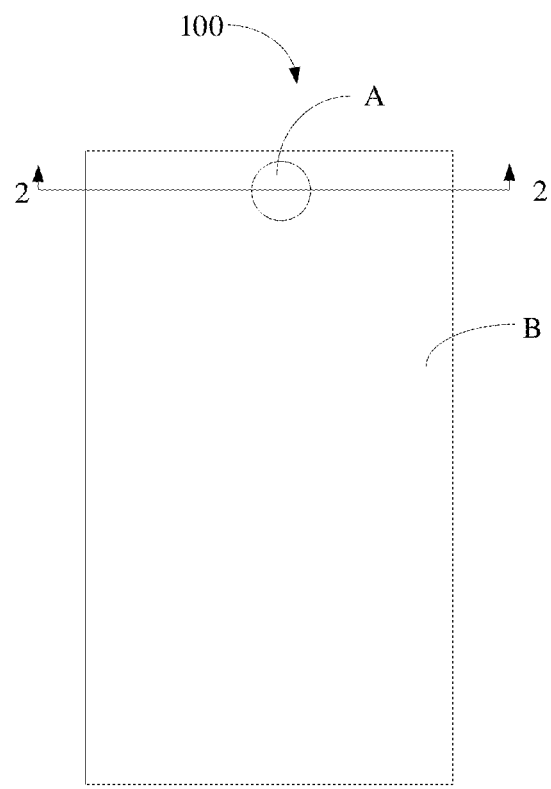
FIG. 1 is a plan view of a display panel according to an embodiment of the present disclosure.
Figure 2:
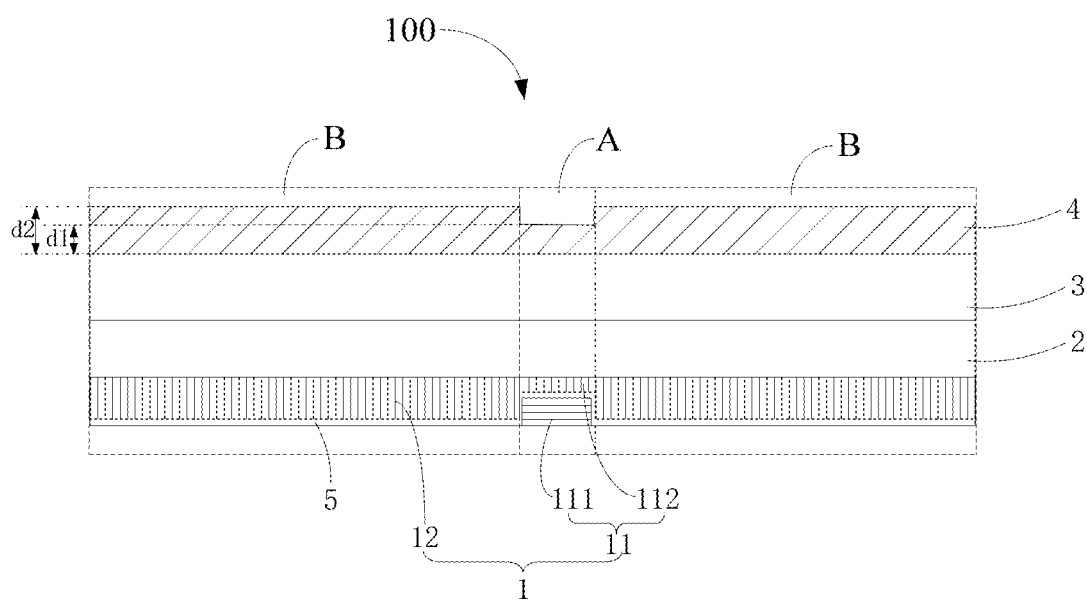
FIG. 2 is a cross-sectional view of the display panel in FIG. 1 taken along line 2-2.

In order to solve the above problem, an embodiment of the present disclosure provides a display panel. As illustrated in FIGS. 1 and 2, the display panel 100 includes a first display area A and a second display area B, and light sensing elements may be disposed beneath the first display area A. The display panel 100 includes a base substrate 1, a driving circuit layer 2, a light emitting functional film layer 3, and a conductive layer 4 which are located in the first display area A and the second display area B. The driving circuit layer 2 is formed on the base substrate 1, the light emitting functional film layer 3 is formed on the driving circuit layer 2, and the conductive layer 4 is formed on the light emitting functional film layer 3. A portion of the conductive layer which is located in the first display area A has a thickness d1 less than the thickness d2 of a portion of the conductive layer which is located in the second display area B.

In the embodiments of the present disclosure, for the convenience of description, a direction from the base substrate 1 towards the driving circuit layer 2 is defined as upward, and a direction from the driving circuit layer 2 towards the base substrate 1 is defined as downward, so as to determine the up-down direction. Different definitions for direction will not affect an actual operation content of the process and an actual shape of a product.

In the display panel 100 according to the embodiment of the present disclosure, since the portion of the conductive layer which is located in the first display area A has the thickness less than the thickness of the portion of the conductive layer which is located in the second display area B, the light transmittance of the first display area A may be greater than the light transmittance of the second display area B, so that the light sensing elements disposed beneath the first display area A can receive enough light to guarantee the light sensing element to operate properly.

The second display area B may at least partially surround the first display area A. In the display panel 100 as illustrated in FIG. 1, the second display area B completely surrounds the first display area A. In other embodiments, the second display region B may partially surround the first display region A. The second display region B is the primary display region of the display panel 100, and typically occupies more than 90% of the area of the display panel. Light sensing elements such as a camera and a light sensor may generally be configured underneath the first display region A.

Figure 3:
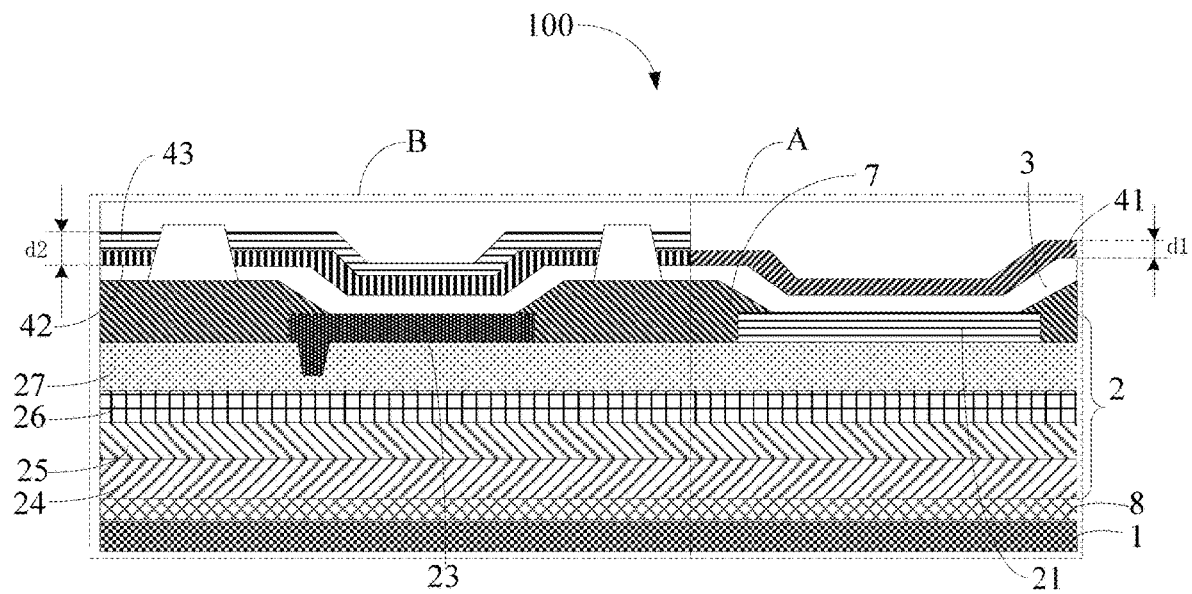
FIG. 3 is a partial cross-sectional view of the display panel in FIG. 1.

In one embodiment, referring to FIG. 3, the portion of the conductive layer 4 which is located in the first display region A is a first sub-conductive layer 41, and the portion of the conductive layer 4 which is located in the second display region includes a second sub-conductive layer 42 and a third sub-conductive layer 43 on the second sub-conductive layer 42.

The material of the first sub-conductive layer 41 is indium tin oxide, indium zinc oxide, indium tin oxide doped with silver, or indium zinc oxide doped with silver. Or, the material of the first sub-conductive layer 41 includes at least one of Mg or Ag. Preferably, the first sub-conductive layer 41 includes both Mg and Ag, and the ratio of the mass of Mg to the mass of Ag ranges from 1:4 to 1:20. In this way, the light transmittance of the first display region A may be ensured to be greater, so that the sensor provided beneath the first display region A may receive more light.

One of the second sub-conductive layer 42 and the third sub-conductive layer 43 may be made of the same material as the first sub-conductive layer 41, and may be formed in a single process step. When forming the conductive layer 4, the second sub-conductive layer 42 and the first sub-conductive layer 41 are formed simultaneously, and then the third sub-conductive layer 43 is formed on the second sub-conductive layer 42. The second sub-conductive layer 42 and the first sub-conductive layer 41 are made of the same material, and the material for the third sub-conductive layer 43 may include at least one of Mg or Ag. Alternatively, when forming the conductive layer 4, the second sub-conductive layer 42 is formed first, and then the first sub-conductive layer 41 and the third sub-conductive layer 43 are formed at the same time. And the materials of the first sub-conductive layer 41 and the third sub-conductive layer 43 are the same. The material of the second sub-conductive layer 42 may include at least one of Mg or Ag.

In one embodiment, the conductive layer 4 may be a cathode layer. The cathode layer may be a planar electrode covering the entire region of the display panel 100. That is, the first sub-conductive layer 41 covers the first display region A, and the second sub-conductive layer 42 and the third sub-conductive layer 43 cover the second display region B.

In one embodiment, the ratio of the thickness of the first sub-conductive layer 41 in the first display region A to the thickness of the conductive layer in the second display region B (that is, the overall thickness of the second sub-conductive layer 42 and the third sub-conductive layer 43) may range from 0.25:1 to 0.85:1. For example, the ratio may be 0.3, 0.5, 0.7, 0.85, etc. In the embodiments of the present disclosure, the thickness refers to the dimension of the film layer in the up-down direction.

Further, the thickness of the first sub-conductive layer 41 in the first display region A may range from 5 nm to 10 nm, and the overall thickness of the second sub-conductive layer 42 and the third sub-conductive layer 43 in the second display region B may range from 12 nm to 20 nm. In this way, the light transmittance of the first sub-conductive layer 41 may be kept at a good level, and the conductive performance and mechanical performance of the conductive layer 4 may be guaranteed, thus the display panel 100 can operate properly.

In one embodiment, the light emitting functional film layer 3 may include an organic light emitting material and a common layer. The common layer may include an electron injection layer, an electron transport layer, a hole injection layer, and a hole transport layer. The electron injection layer and the electron transport layer are located between the organic light emitting material and the conductive layer 4, and the hole injection layer and the hole transport layer are located between the driving circuit layer 2 and the organic light emitting material. The electron injection layer, the electron transport layer, the hole injection layer and the hole transport layer are each arranged in a form of an entire layer covering the first display region A and the second display region B.

Further, the material of the electron injection layer includes Ag, and at least one of Mg, K, Li, or Cs. Preferably, the ratio of the mass of Ag in the electron injection layer to the total mass of the electron injection layer is in a range of 1:5~1:21. That is, the ratio of the mass of Ag to the mass of other components in the electron injection layer is in a range of 1:4~1:20.

The display panel 100 may further include a pixel defining layer 7 disposed in the same layer as the light emitting functional film layer 3. Pixel openings may be provided in the pixel defining layer 7, and the organic light emitting material of the light emitting functional film layer 3 is disposed within the pixel openings.

In one embodiment, referring to FIG. 2 again, the base substrate 1 may include a first base substrate 11 and a second base substrate 12. The first base substrate 11 is located in the first display region A, and the second base substrate 12 is located in the second display region B. And the light transmittance of the first base substrate 11 is greater than the light transmittance of the second base substrate 12. In this way, the light transmittance of the first display region A may be greater, which is more advantageous for the light sensing elements provided beneath the first display region A to receive more light.

The base substrate 1 may be a flexible base substrate or a rigid base substrate. The rigid base substrate may be a transparent base substrate such as a glass base substrate, a quartz base substrate, or a plastic base substrate.

Figure 4:
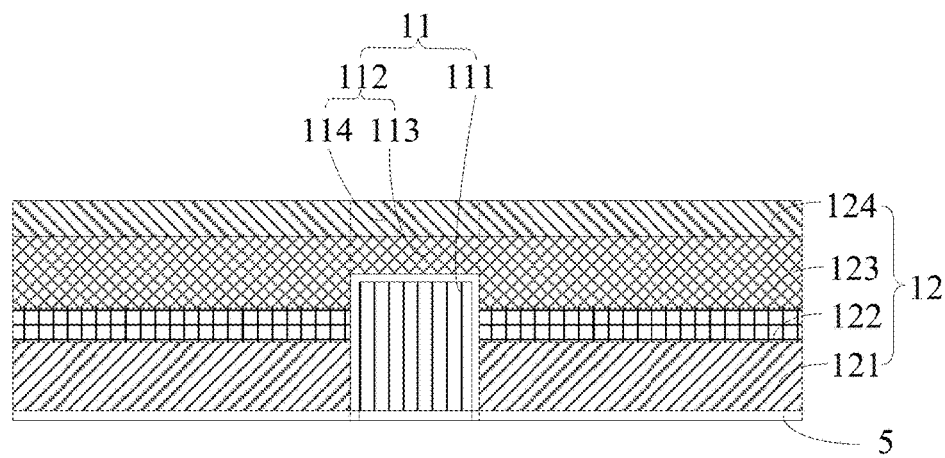
FIG. 4 is a cross-sectional view of a base substrate of the display panel illustrated in FIG. 1.

When the base substrate 1 is a flexible base substrate, referring to FIG. 4, the second base substrate 12 may be a stack structure in which one or more organic layers and one or more inorganic layers are alternately laminated. The first base substrate at least includes a transparent material layer 111, and the thickness of the first base substrate 11 is the same as the thickness of the second base substrate 12. When the thickness of the first base substrate 11 is the same as the thickness of the second base substrate 12, it is advantageous for the entire display panel 100 to have a uniform thickness, thereby making the overall display panel 100 to be more aesthetic.

In order to guarantee the high light transmittance of the first base substrate 11, the transparent material layer 111 is made of a material of high light transmittance. Preferably, the light transmittance of the transparent material layer 111 of the first base substrate 11 may be greater than 90%. Further, the material of the transparent material layer 111 of the first base substrate 11 may include at least one of PET (polyethylene terephthalate) or PC (polycarbonate). The light transmittance of each of PET and PC is 92%, which may make the light transmittance of the first base substrate 11 to be high.

In order to guarantee that the brightness of the second display region B is high when the display panel 100 is operating, the light transmittance of the second display region B needs to be low to reduce the brightness loss of the second display region B. The light transmittance of the second base substrate 12 of the second display region B may ranges from 30% to 60%, so as to reduce the light transmittance of the second display region B, and to increase the brightness of the second display region B during display.

The material of the organic layer of the second base substrate 12 may be PI (polyimide). A refractive index of PI is not much different from those of PET and PC, and thus the first base substrate 11 and the second base substrate 12 have approximate refractive indexes, so that it may avoid a greater difference of the display effect between the first display region A and the second display region B resulting from the difference of the refractive indexes between the first base substrate 11 and the second base substrate 12, which makes the overall display effect of the display panel 100 to be more uniform. The material of the inorganic layer of the second base substrate 12 may be $SiO_2$, SiNx, or the like.

Further, the first base substrate 11 further includes a stack structure 112 in which one or more organic layers and one or more inorganic layers are alternately laminated. The stack structure 112 of the first base substrate 11 and the stack structure of the second base substrate 12 share a part of the film layers. Specifically, the organic layer of the first base substrate 11 and the organic layer of the second base substrate 12 which are disposed in the same layer share the same film layer. And the inorganic layer of the first base substrate and the inorganic layer of the second base substrate 12 which are disposed in the same layer share the same film layer.

Referring to FIG. 4 again, the stack structure 112 of the first base substrate 11 may include a first organic layer 113 and a first inorganic layer 114 disposed on the first organic layer 113. And the stack structure of the second base substrate 12 includes a second organic layer 121, a second inorganic layer 122, a third organic layer 123, and a third inorganic layer 124 that are sequentially and alternately laminated from bottom to top. The first organic layer 113 and a part of the third organic layer 123 share the same film layer, and the first inorganic layer 114 and the third inorganic layer 124 share the same film layer. A thickness of the first organic layer 113 is less than a thickness of the third organic layer 123, and a thickness of the first inorganic layer 114 is equal to a thickness of the third inorganic layer 124. The first inorganic layer 114 and the third inorganic layer 124 sharing the same film layer means that the first inorganic layer and the third inorganic layer are formed of the same material through a single process step. The first organic layer 113 and a part of the third organic layer 123 sharing the same film layer means that the first organic layer and the third organic layer are formed of the same material at the same time. When forming the first organic layer 113 and the third organic layer 123, an organic layer with uniform thickness may be formed at the same time, and then a portion of the organic layer located in the first display region A is partially etched away, thereby forming the first organic layer 113 and the third organic layer 123.

The transparent material layer 111 of the first base substrate 11 may be disposed beneath the stack structure 112 of the first base substrate 11, and a bottom surface of the transparent material layer 111 of the first base substrate 11 is flush with a bottom surface of the second base substrate 12. Furthermore, if a top surface of the stack structure 112 of the first base substrate 11 is flush with a top surface of the second base substrate 12, then the overall thickness of the first base substrate 11 is the same as the overall thickness of the second base substrate 12, so that it facilitates the display panel 100 to have a substantially uniform thickness, and facilitates the display panel 100 to have an aesthetics appearance.

In an embodiment, referring to FIG. 4 again, a protective layer 5 is disposed beneath the first base substrate 11, beneath the second base substrate 12, as well as between a side surface of the transparent material layer 111 of the first base substrate 11 and the second base substrate, and/or the protective layer 5 is disposed between the top of the transparent material layer 111 of the first base substrate 11 and the stack structure 112 of the first base substrate 11. The protective layer 5 may protect the first base substrate 11 and the second base substrate 12 so as to improve the mechanical strength of the display panel, thereby increasing the service life of the display panel 100.

The material of the protective layer 5 may include at least one of IZO, ITO, SiNx, or SiOx. The above materials may make the light transmittance of the protective layer 5 to be high, and prevent the protective layer 5 from affecting the light transmittance of the first display region A.

In an embodiment, a buffer layer 8 may be disposed between the base substrate 1 and the driving circuit layer 2. The material of the buffer layer 8 may be SiNx or SiOx. The buffer layer 8 may improve the bonding between the base substrate 1 and the driving circuit layer 2, so as to avoid separation of the base substrate 1 and the driving circuit layer 2, and further improve the service life of the display panel 100.

In the display panel 100 according to the embodiment of the present disclosure, the driving mode for the first display region A may be passive or active. When the driving mode for the first display region A is passive, the first display region A is a display region of Passive-Matrix Organic Light Emitting Diode (PMOLED); when the driving mode of the first display region A is active, the first display region A is a display region of Active-Matrix Organic Light Emitting Diode (AMOLED). The driving mode of the second display region B is active, and the second display region is an AMOLED display region.

FIG. 3 is a cross-sectional view of the first display region A and a part of the second display region B in the display panel 100 taken along line 2-2 in FIG. 1. Referring to FIG. 3, a part of the driving circuit layer 2 which is located in the second display region B may include a gate insulating layer 24, a capacitor insulating layer 25 on the gate insulating layer 24, an interlayer dielectric layer 26 on the capacitor insulating layer 25, a planarization layer 27 on the interlayer dielectric layer 26, an anode layer 23 on the planarization layer 27, and transistors (not shown) and storage capacitors (not shown) provided between the film layers. The anode layer 23 may be a sandwich structure in which a film layer of Ag is provided between two indium tin oxide film layers.

When the first display region A is a PMOLED display region, the structure of the part of the driving circuit layer 2 which is located in the first display region A may be one of the followings.

In a first implementation, referring to FIG. 3, the part of the driving circuit layer 2 which is located in the first display region A includes a gate insulating layer 24, a capacitor insulating layer 25 on the gate insulating layer 24, an interlayer dielectric layer 26 on the capacitor insulating layer 25, a planarization layer 27 on the interlayer dielectric layer 26, and an anode layer 21 on the planarization layer 27. The gate insulating layer 24, the capacitor insulating layer 25, the interlayer dielectric layer 26, the planarization layer 27, and the anode layer located on the planarization layer 27 in the first display region A are located at the same layer as the respective corresponding film layers in the second display region B respectively, and are formed with the corresponding film layer in the second display region B through a single process respectively. The anode layer 21 may be a single film layer made of transparent material. Further, the light transmittance of the transparent material of the anode layer 21 is greater than or equal to 90%. Preferably, the transparent material is indium tin oxide, indium zinc oxide, indium tin oxide doped with silver or indium zinc oxide doped with silver. In this way, the light transmittance of the anode layer 21 of the first display region A may be high, and the light transmittance of the first display region A can be improved.

In a second implementation, the part of the driving circuit layer 2 which is located in the first display region A may only include the anode layer 21 without other film layers, so that the driving circuit layer of the first display region A may have high light transmittance. The anode layer 21 may be a single film structure made of transparent material. Further, the light transmittance of the transparent material for fabricating the anode layer 21 is greater than or equal to 90%. Preferably, the transparent material is indium tin oxide, indium zinc oxide, indium tin oxide doped with silver or indium zinc oxide doped with silver.

Figure 5:
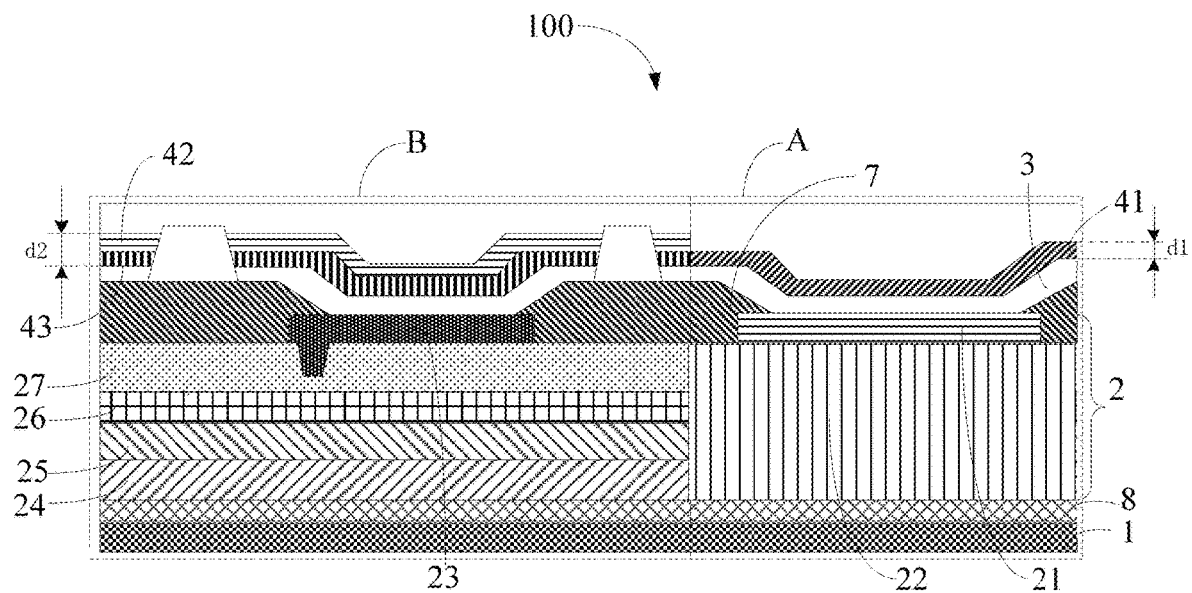
FIG. 5 is a partial cross-sectional view of another display panel.

In a third implementation, referring to FIG. 5 (FIG. 5 is a cross-sectional view of the first display region A and a part of the second display region B in the display panel 100 taken along line 2-2 in FIG. 1), the part of the driving circuit layer 2 which is located in the first display region A may include the anode layer 21 and a transparent organic film layer 22 disposed beneath the anode layer 21. The transparent organic film layer 22 and the anode layer 21 may be made of transparent material, and the anode layer 21 may be a single film layer structure made of transparent material. Further, the light transmittance of both the transparent organic film layer 22 and the anode layer 21 is both greater than 90%. Preferably, the transparent material for fabricating the anode layer 21 is indium tin oxide, indium zinc oxide, indium tin oxide doped with silver, or indium zinc oxide doped with silver. The material for the transparent organic film layer 22 may be PET, PC, or the like. Furthermore, the total thickness of insulating layers of the second display region B (that is, the gate insulating layer 24, the capacitor insulating layer 25, the interlayer dielectric layer 26, and the planarization layer 27 of the second display region B) is equal to a thickness of the transparent organic film layer 22 of the first display region A, so that the part of the driving circuit layer 2 which is located in the first display region A and the part of the driving circuit layer 2 which is located in the second display region B have the same thickness, which facilitates the display panel 100 to have a substantially uniform thickness, thereby improving the aesthetic appearance of the display panel 100.

When the first display region A is an AMOLED display region, the part of the driving circuit layer 2 which is located in the first display region A is provided with a plurality of transistors and a plurality of storage capacitors. The plurality of transistors and the plurality of storage capacitors constitute a plurality of first driving circuit units which are configured to drive the organic light emitting material of the light emitting functional film layer 3 to emit light, so that the first display region A displays.

The second display region B is an AMOLED display region. The part of the driving circuit layer 2 which is located in the second display region B is provided with a plurality of transistors and a plurality of storage capacitors. The plurality of transistors and the plurality of storage capacitors constitute a plurality of second driving circuit units which are configured to drive the organic light emitting material of the light emitting functional film layer 3 to emit light, so that the second display region B displays.

In one embodiment, the number of transistors of the first driving circuit unit is less than the number of transistors of the second driving circuit unit. Optionally, the first driving circuit unit may be a 2T1C driving circuit (that is, the first driving circuit unit includes two transistors and one storage capacitor). Or the first driving circuit unit may be a 3T1C driving circuit (that is, the first driving circuit unit includes three transistors and one storage capacitor). The second driving circuit unit may be, for example, a 7T1C circuit (that is, the second driving circuit unit includes seven transistors and one storage capacitor), a 5T1C circuit (that is, the second driving circuit unit includes five transistors and one storage capacitor), a 4T1C circuit (that is, the second driving circuit unit includes four transistors and one storage capacitor) and so on. With such arrangements, the structure of the first driving circuit unit is less complex than the structure of the second driving circuit unit, so that the area of the conductive layer in the part of the driving circuit layer 2 which is located in the first display region A is small, which can further improve the light transmittance of the first display region A.

Figure 6:
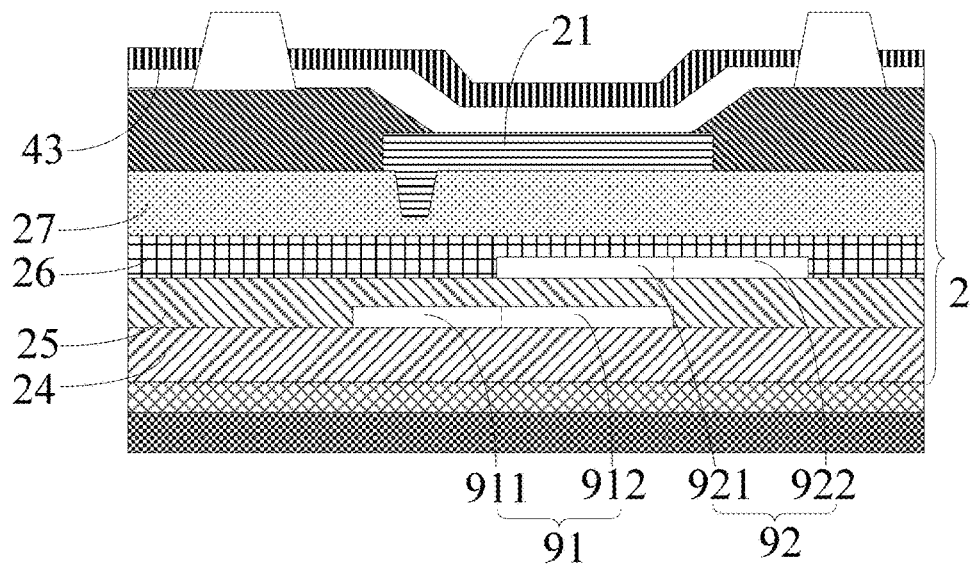
FIG. 6 is a cross-sectional view of a first display area of a display panel according to an embodiment of the present disclosure.
Figure 8:
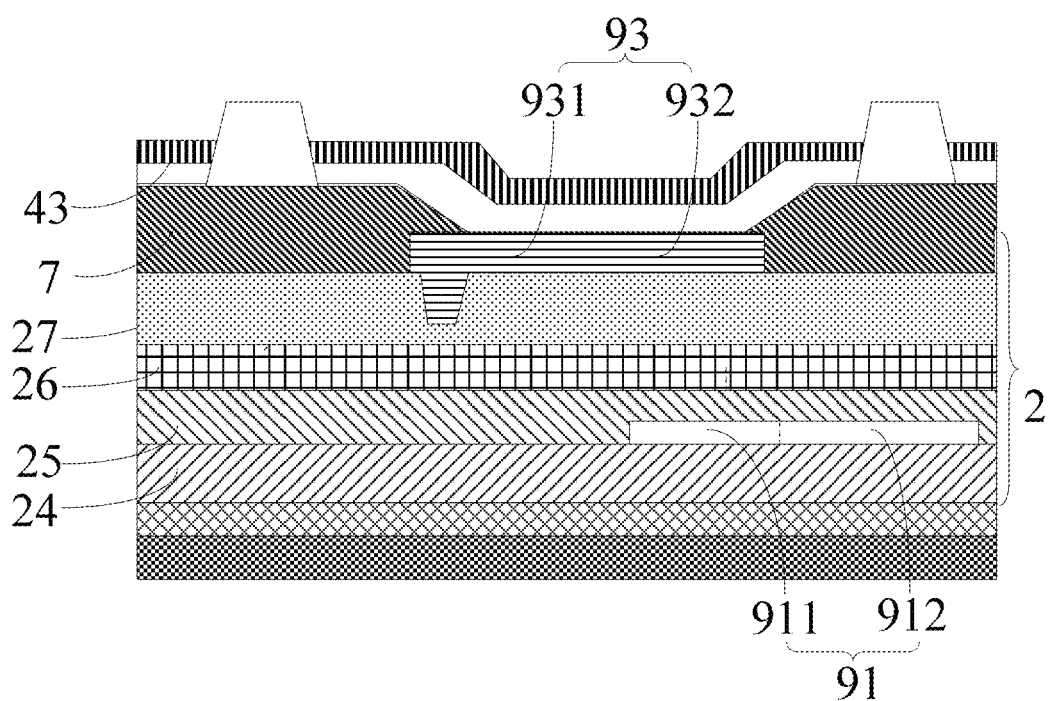
FIG. 8 is a cross-sectional view of a first display area of another display panel according to an embodiment of the present disclosure.

The transistors of the first driving circuit unit may include a first transistor, and the storage capacitor of the first driving circuit unit includes a first electrode plate and a second electrode plate. Referring to FIGS. 6 and 8, the part of the driving circuit layer 2 which is located in the first display region A includes a gate insulating layer 24, a capacitor insulating layer 25 on the gate insulating layer 24, and an interlayer dielectric layer 26 on the capacitor insulating layer 25, a planarization layer 27 on the interlayer dielectric layer 26, as well as a first conductive layer 91 disposed between the gate insulating layer 24 and the capacitor insulating layer 25. A part 912 of the first conductive layer 91 serves as the first electrode plate of the storage capacitor and another part 911 serves as a gate electrode of the first transistor. With such an arrangement, when the gate electrode of the first transistor, the first electrode plate of the storage capacitor as well as a connection therebetween may be completed through a single process step, and there is no need to fabricate a connection structure therebetween after the gate electrode of the first transistor and the first electrode plate of the storage capacitor are formed. In this way, the manufacturing process of the first driving circuit unit can be simplified. The first electrode plate may be the lower electrode plate of the storage capacitor, and the second electrode plate may be the upper electrode plate of the storage capacitor.

When the first driving circuit unit is a 2T1C driving circuit, the part of the driving circuit layer in the first display region further includes a power supply line, a data line, a scan line, and anode layers in one to one correspondence with the plurality of first driving circuit units. As illustrated in FIG. 6, the part of the driving circuit layer 2 which is located in the first display region includes second conductive layers 92, and anode layers 21 on the planarization layer 27 and corresponding to the first driving circuit units in one-to-one manner. A part 921 of the second conductive layer 92 serves as the second electrode plate of the storage capacitor, and another part 922 serves as a power supply line. With such an arrangement, the power supply line, the second electrode plate of the storage capacitor and the connection therebetween can be completed through a single process step, and there is no need to fabricate the connection therebetween after the power supply line and the second electrode plate of the storage capacitor are formed. In this way, the manufacturing process of the first driving circuit unit can be simplified.

In addition to the first conductive layer 91, the second conductive layer 92, and the anode layer 21 illustrated in FIG. 6, the part of the driving circuit layer 2 which is located in the first display region A further includes a data line, a scan line, source and drain electrodes of the first transistor, as well as gate, source and drain electrodes of the second transistor, which are not illustrated in FIG. 6.

Figure 7:
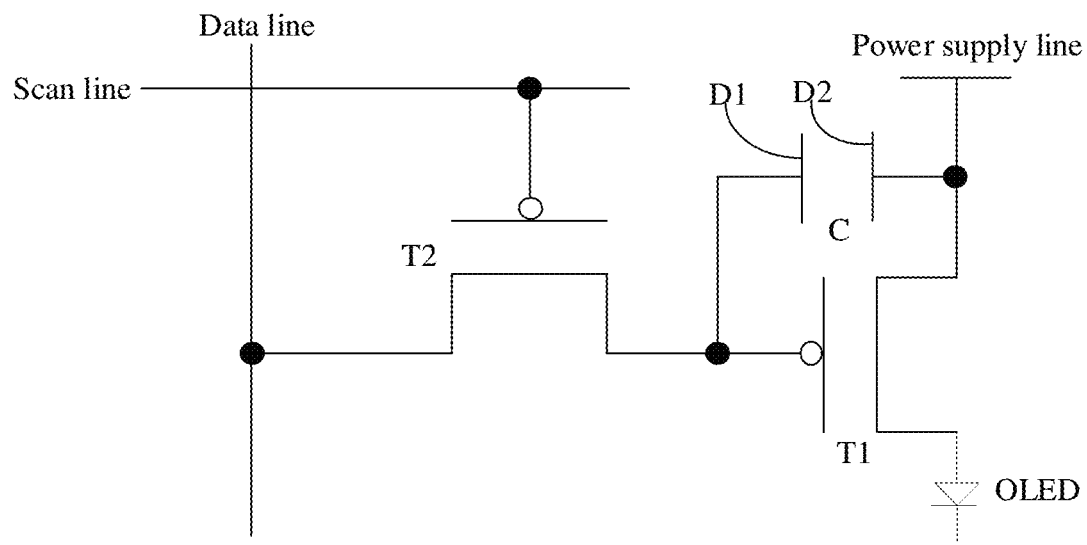
FIG. 7 is a circuit schematic diagram of a first driving circuit unit according to an embodiment of the present disclosure.

When the first driving circuit unit is a 2T1C driving circuit, the schematic circuit diagram is as illustrated in FIG. 7. The transistors of the first driving circuit unit include a first transistor T1 and a second transistor T2. The source electrode of the first transistor T1 and the second electrode plate D2 of the storage capacitor C are respectively connected to a power supply line, the drain electrode of the first transistor T1 is connected to an anode layer of a corresponding OLED (Organic Light Emitting Diode), and the gate electrode of the first transistor is connected to the first electrode plate D1 of the storage capacitor C. The gate electrode of the second transistor T2 is connected to the scan line, the drain electrode of the second transistor T2 is connected to the first electrode plate D1 of the storage capacitor C and the gate electrode of the first transistor T1, respectively, and the source electrode of the second transistor T2 is connected to the data line.

Since the drain electrode of the second transistor T2 is connected to the first electrode plate D1 of the storage capacitor C and the gate electrode of the first transistor T1, respectively, with a part of the first conductive layer serving as the first electrode plate D1 of the storage capacitor C as well as another part of the first conductive layer serving as the gate electrode of the first transistor T1, the drain electrode of the second transistor T2 is directly connected to the first conductive layer in terms of configuration. Since the source electrode of the first transistor T1 is connected to the second electrode plate D2 of the storage capacitor C and the power supply line, with a part of the second conductive layer serving as the second electrode plate D2 of the storage capacitor C as well as another part of the second conductive layer serving as the power supply line, the source electrode of the first transistor T1 is connected to the second conductive layer in terms of configuration.

In one embodiment, the material of the first transistor T1, the second transistor T2, the storage capacitor C, the data line, the scan line, and the anode layer may be made of transparent material. Preferably, the light transmittance of the transparent material is greater than or equal to 90%. Further, the transparent material is indium tin oxide, indium zinc oxide, indium tin oxide doped with silver or indium zinc oxide doped with silver. In this way, the light transmittance of the driving circuit layer in the first display region A can be high, and thus the light transmittance in the first display region A can be improved.

When the first driving circuit unit is a 3T1C driving circuit, the driving circuit layer located in the first display region A includes a power supply line, a data line, a first scan line, a second scan line, a reference potential line, and anode layers corresponding to the plurality of first driving circuit units in one-to-one manner. As illustrated in FIG. 8, the part of the driving circuit layer 2 which is located in the first display region includes the first conductive layer 91 and a third conductive layer 93 which is on the planarization layer 27. A part 932 of the third conductive layer 93 serves as the second electrode plate, and another part 931 serves as a corresponding anode layer. With such an arrangement, the anode layer, the second electrode plate of the storage capacitor and the connection therebetween can be completed through a single process step, and there is no need to fabricate a connection therebetween after the anode layer and the second electrode plate of the storage capacitor are formed. The manufacturing process of the first driving circuit unit can be simplified.

In addition to the first conductive layer 91 and the third conductive layer 93 illustrated in FIG. 8, the part of the driving circuit layer 2 which is located in the first display region further includes a power supply line, a data line, a first scan line, a second scan line, a reference potential line, source and drain electrodes of the first transistor, gate, source and drain electrodes of the third transistor, as well as gate, source and drain electrodes of the fourth transistor, which are not shown in FIG. 8.

Figure 9:
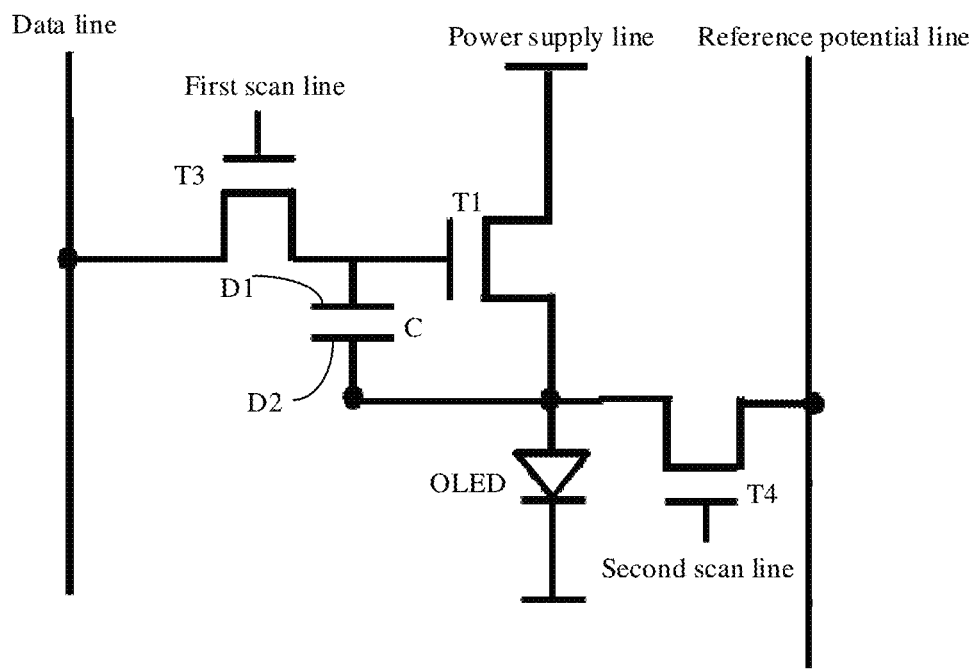
FIG. 9 is another circuit schematic diagram of a first driving circuit unit according to an embodiment of the present disclosure.

When the first driving circuit unit is a 3T1C driving circuit, the schematic circuit diagram is as illustrated in FIG. 9. The transistors of the first driving circuit unit include a first transistor T1, a third transistor T3, and a fourth transistor T4. The source electrode of the third transistor T3 is connected to the data line, the gate electrode of the third transistor T3 is connected to the first scan line, and the drain electrode of the third transistor T3 is connected to the first electrode plate D1 of the storage capacitor C and the gate electrode of the first transistor T1, respectively. The drain electrode of the first transistor T1 is connected to the power supply line, and the source electrode of the first transistor T1 is connected to an anode layer of an OLED and the second electrode plate D2 of the storage capacitor C, respectively. The gate electrode of the fourth transistor T4 is connected to the second scan line, the source electrode of the fourth transistor T4 is connected to the reference potential line, and the drain electrode of the fourth transistor T4 is connected to the anode layer of the OLED.

Since the drain electrode of the third transistor T3 is connected to the first electrode plate of the storage capacitor C and the gate electrode of the first transistor T1, respectively, with a part of the first conductive layer serving as the first electrode plate of the storage capacitor C as well as another part serving as the gate electrode of the first transistor T1, the drain electrode of the third transistor T3 is connected to the first conductive layer in terms of configuration. Since the source electrode of the first transistor T1 is connected to the anode layer and the second electrode plate D2 of the storage capacitor C, respectively, and the drain electrode of the fourth transistor T4 is connected to the anode layer, with a part of the third conductive layer serving as the second electrode plates D2 of the storage capacitors C as well as another part serving as the corresponding anode layer, in terms of configuration, the source electrode of the first transistor T1 and the drain electrode of the fourth transistor T4 are respectively connected to the third conductive layer.

In one embodiment, the first transistor T1, the third transistor T3, the fourth transistor T4, the storage capacitor C, the data line, the first scan line, the second scan line, the reference potential line and the anode layer of the first driving circuit unit are all made of transparent material. Preferably, the light transmittance of the transparent material is greater than or equal to 90%. Further, the transparent material is indium tin oxide, indium zinc oxide, indium tin oxide doped with silver or indium zinc oxide doped with silver. In this way, the light transmittance of the driving circuit layer of the first display region A can be high, and thus the light transmittance of the first display region A can be improved.

Figure 10:
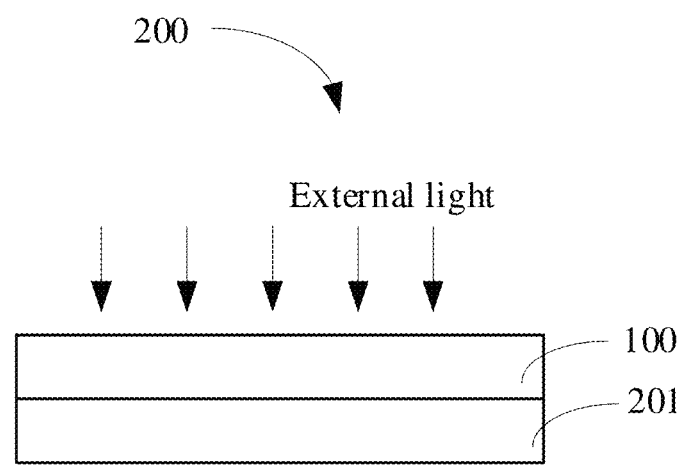
FIG. 10 is a side view of a display device according to an embodiment of the present disclosure.
Figure 11:
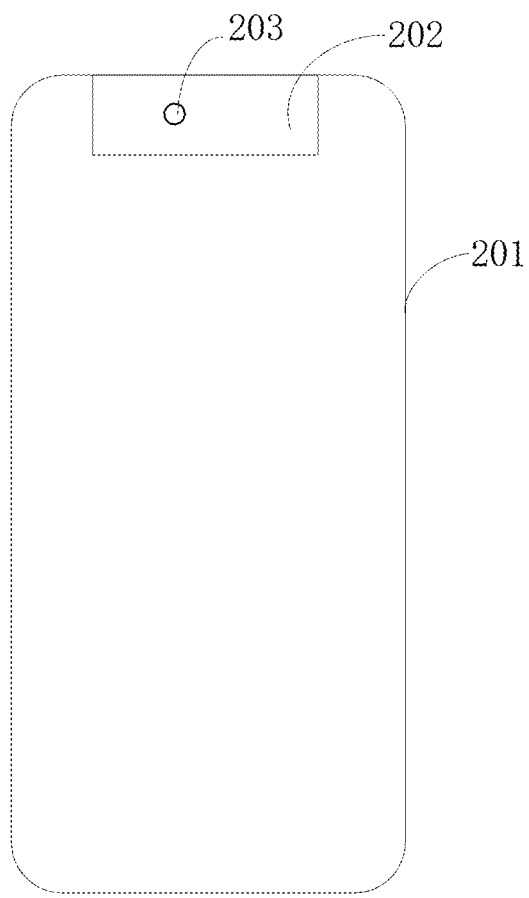
FIG. 11 is a schematic structural view of a device body of the display device illustrated in FIG. 10.

An embodiment of the present disclosure further provides a display device 200. As illustrated in FIG. 10, the display device 200 includes a device body 201 and the display panel 100 mentioned above. As illustrated in FIG. 11, the device body 201 includes a component region 202, and the display panel 100 covers the device body 201. The component region 202 is located beneath the first display region of the display panel 100, and the component region 202 is provided with a light sensing element 203 that collects light through the first display region of the display panel 100.

The light sensing element 203 may include a camera and/or a light sensor. In the component region 403, other elements in addition to the light sensing element 203, such as a gyroscope or an earpiece, may further be provided.

The component region 202 may be a notched region, and the first display region of the display panel 100 may be arranged corresponding to the notched region, so that the light sensing element 203 may collect external light through the first display region and perform other operations.

The above-mentioned display device 200 includes the display panel 100 in which the thickness of the conductive layer in the first display region is smaller than the thickness of the conductive layer in the second display region, so that the light transmittance of the first display region is greater than the light transmittance of the second display region, thereby enabling the light sensing element disposed beneath the first display region to receive enough light to guarantee the light sensing element to operate properly.

The above-mentioned electronic device such as the display device may be a digital device such as a mobile phone, a tablet PC, a palmtop computer, an ipad, or the like.

Figure 12:
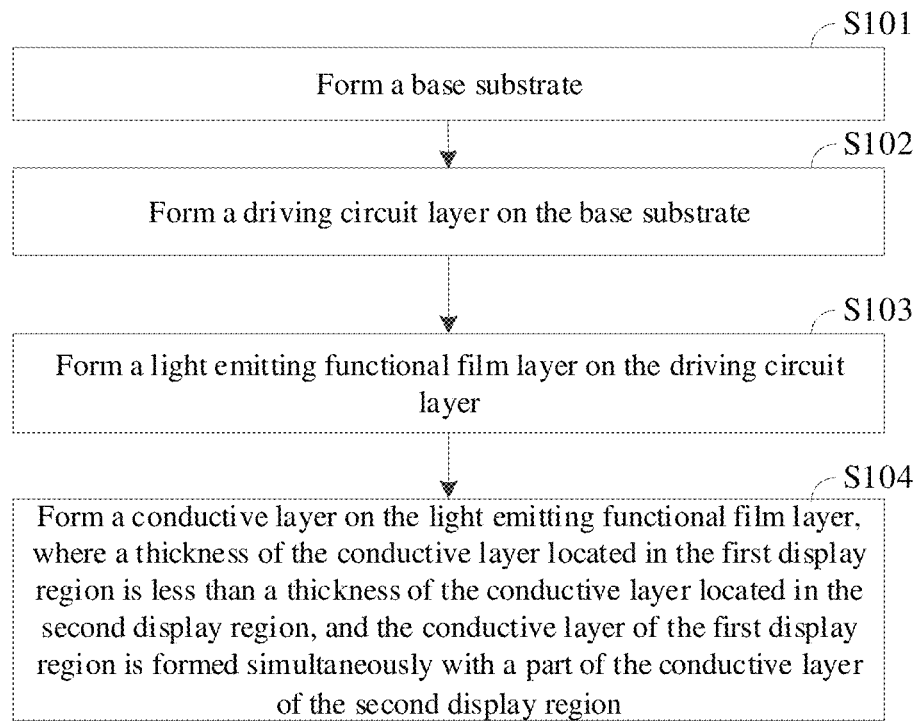
FIG. 12 is a flowchart of a method of manufacturing a display panel according to an embodiment of the present disclosure.

Embodiments of the present disclosure further provide a method of manufacturing a display panel. The display panel includes a first display region and a second display region. The manufacturing method includes the following steps 101 to 104, as illustrated in FIG. 12.

At step 101, a base substrate is formed.

The base substrate may be a flexible base substrate or a rigid base substrate. The rigid base substrate may be a transparent base substrate such as a glass substrate, a quartz base substrate, or a plastic base substrate.

Figure 13:
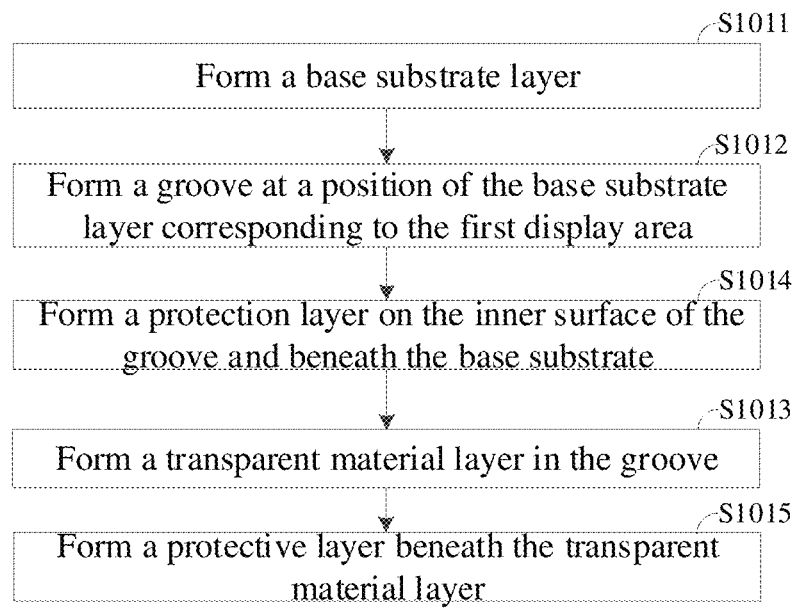
FIG. 13 is a flowchart of a method of forming a base substrate in FIG. 12.

When the base substrate is a flexible base substrate, the step 101 of forming the base substrate may include the following steps 1011 to 1015, as illustrated in FIG. 13.

At step 1011, a base substrate layer is formed.

Figure 14:
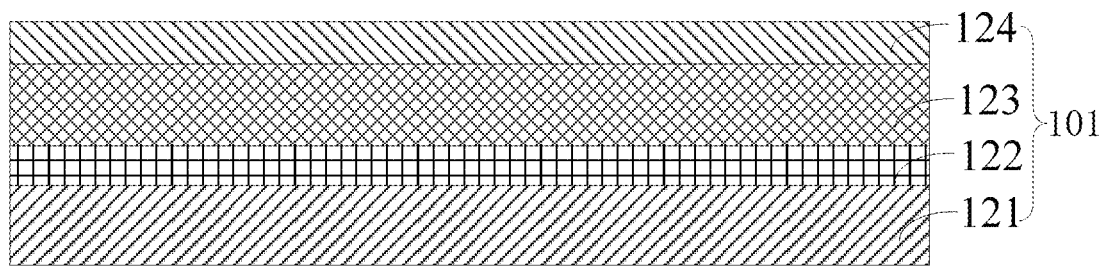
FIG. 14 is a schematic structural diagram of a base substrate layer according to an embodiment of the present disclosure.

The base substrate layer may be a stack structure in which one or more organic layers and one or more inorganic layers are alternately laminated. As illustrated in FIG. 14, the base substrate layer 101 includes a second organic layer 121, a second inorganic layer 122, a third organic layer 123, and a third inorganic layer 124 that are sequentially and alternately laminated from bottom to top.

At step 1012, a groove is formed at a position of the base substrate layer corresponding to the first display region.

Figure 15:
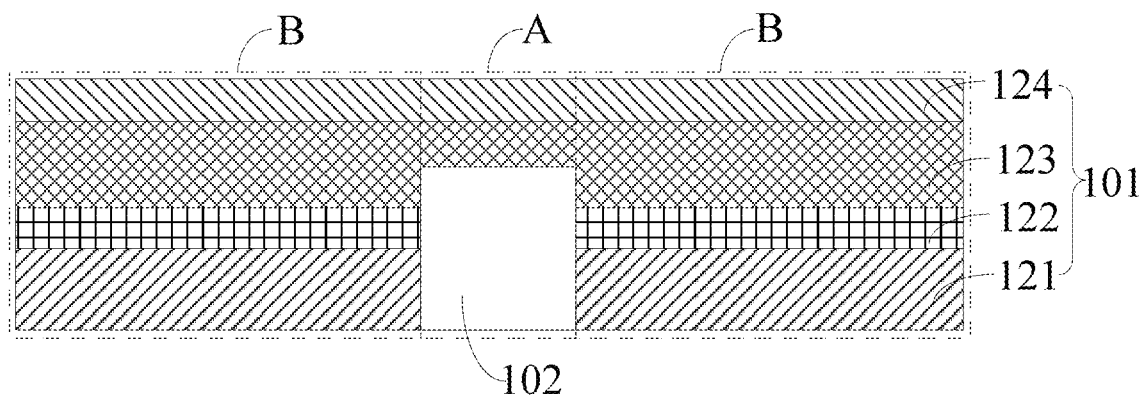
FIG. 15 is a schematic structural diagram of a first intermediate structure according to an embodiment of the present disclosure.

A first intermediate structure may be obtained through step 1012. FIG. 15 is a schematic structural diagram of the first intermediate structure. As illustrated in FIG. 15, a groove 102 is formed at a bottom portion of the base substrate layer 101. An etching process may be used to etch away the second organic layer 121, the second inorganic layer 122 and a part of the third organic layer 123 of a certain thickness thereof which are located in the first display region A, so as to form the groove 102.

At step 1013, a transparent material layer is formed in the groove.

The light transmittance of the transparent material layer may be greater than 90%. Further, the material of the transparent material layer may include at least one of PET or PC.

Figure 16:
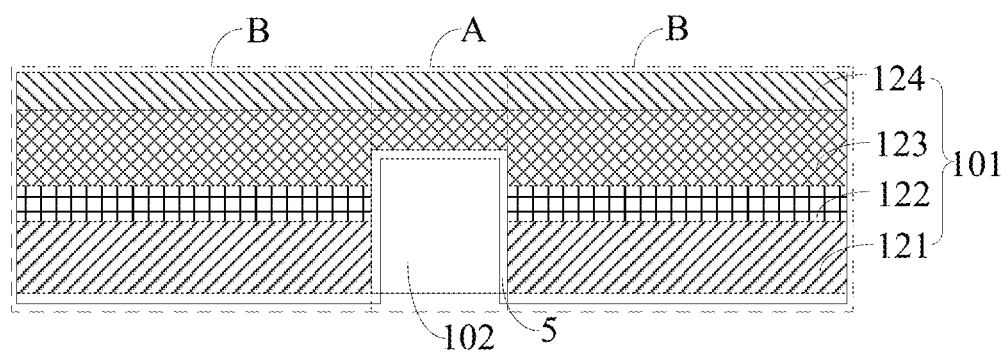
FIG. 16 is a schematic structural diagram of a second intermediate structure according to an embodiment of the present disclosure.

In one embodiment, before the step 1013 of forming the transparent material layer in the groove, the manufacturing method may further include a step 1014: forming a protection layer on the inner surface of the groove and beneath the base substrate layer. Through this step, a second intermediate structure may be obtained. FIG. 16 is a schematic structural diagram of the second intermediate structure. The protective layer 5 is formed on the inner surface of the groove 102 and beneath the part of the base substrate layer 101 which is located in the second display region B.

Figure 17:
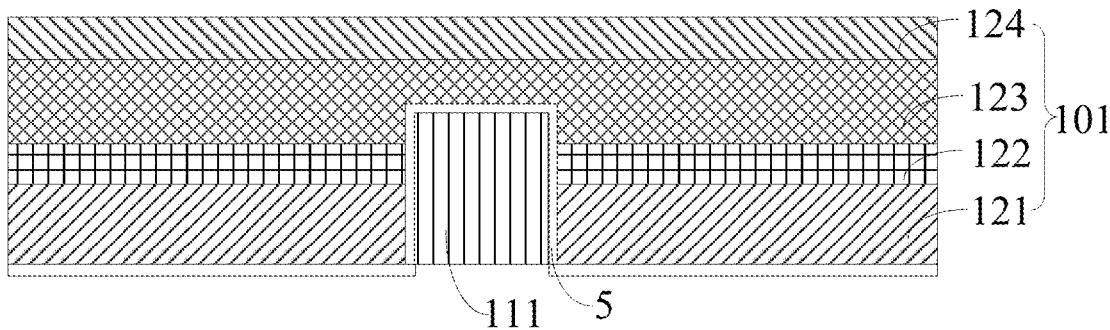
FIG. 17 is a schematic structural diagram of a third intermediate structure according to an embodiment of the present disclosure.

Step 1013 can be implemented on the basis of the second intermediate structure, and a transparent material layer 111 may be formed in the groove 102 on the basis of the second intermediate structure to obtain a third intermediate structure. FIG. 17 is a schematic structural diagram of the third intermediate structure.

Further, after step 1013 of forming the transparent material layer in the groove, the manufacturing method may further include step 1015: forming a protective layer beneath the transparent material layer.

At this step, the protective layer 5 is formed beneath the transparent material layer 111 on the basis of the third intermediate structure, so as to obtain the structure illustrated in FIG. 4, that is, to obtain the base substrate 1.

The bottom surface of the transparent material layer 111 may be flush with the bottom surface of the part of the base substrate layer which is located in the second display region B, so that a portion of the base substrate which is located in the first display region A and a portion of the base substrate which is located in the second display region B have the same thickness.

At step 102, a driving circuit layer is formed on the base substrate.

At step 103, a light emitting functional film layer is formed on the driving circuit layer.

At step 104, a conductive layer is formed on the light emitting functional film layer, where a thickness of the conductive layer located in the first display region is less than a thickness of the conductive layer located in the second display region, and the conductive layer of the first display region is formed simultaneously with a part of the conductive layer of the second display region.

Figure 18:
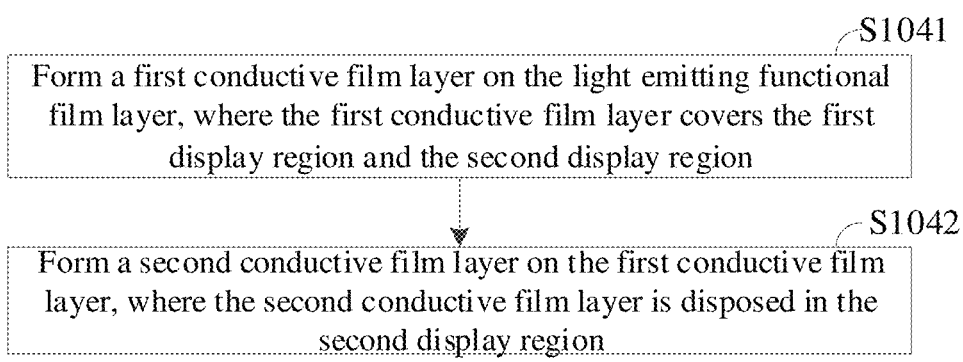
FIG. 18 is a flowchart of a method of forming a conductive layer on a light emitting functional film layer according to an embodiment of the present disclosure.

In one embodiment, as illustrated in FIG. 18, the step 104 of forming the conductive layer on the light emitting functional film layer may be completed through the following steps 1041 and 1042.

At step 1041, a first conductive film layer is formed on the light emitting functional film layer, and the first conductive film layer covers the first display region and the second display region.

Figure 19:
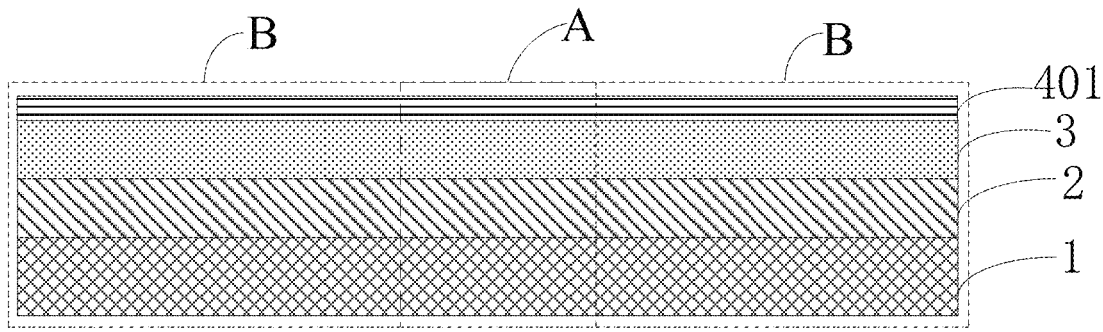
FIG. 19 is a schematic structural diagram of a fourth intermediate structure according to an embodiment of the present disclosure.

A fourth intermediate structure may be obtained through step 1041. FIG. 19 is a schematic structural diagram of the fourth intermediate structure. As illustrated in FIG. 19, the driving circuit layer 2 is formed on the base substrate 1, and the light emitting functional film layer 3 is formed on the driving circuit layer 2, where A denotes a first display region, and B denotes a second display region. The first conductive film layer 401 is formed on the light emitting functional film layer 3, and the first conductive film layer 401 covers the light emitting functional film layer 3 located in both of the first display region A and the second display region B.

The material of the first conductive film layer 401 may be indium tin oxide, indium zinc oxide, indium tin oxide doped with silver, or indium zinc oxide doped with silver. Alternatively, the material of the first conductive film layer 401 includes at least one of Mg or Ag. Preferably, the material of the first conductive film layer 401 includes Mg and Ag, and the mass ratio of Mg to Ag ranges from 1:4 to 1:20.

At step 1042, a second conductive film layer is formed on the first conductive film layer, and the second conductive film layer is only disposed in the second display region.

Figure 20:
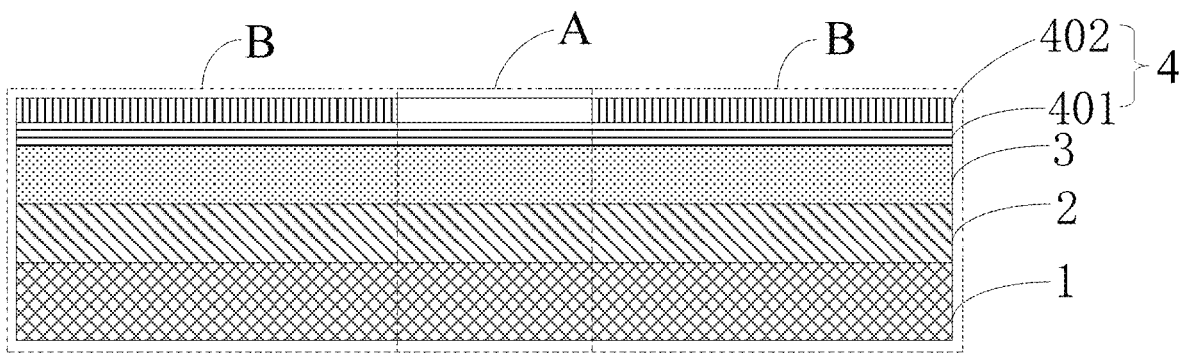
FIG. 20 is a schematic structural diagram of a fifth intermediate structure according to an embodiment of the present disclosure.

A fifth intermediate structure may be obtained through step 1042. FIG. 20 is a schematic structural diagram of the fifth intermediate structure. The second conductive film layer 402 is only disposed in the second display region B.

Therefore, in the conductive layer 4 obtained through steps 1041 and 1042, a part of the conductive layer 4 which is located in the first display region A only includes the first conductive film layer 401, and a part of the conductive layer 4 which is located in the second display region B includes the first conductive film layer 401 and a second conductive film layer 402.

The material of the second conductive film layer may include at least one of Mg or Ag.

Figure 21:
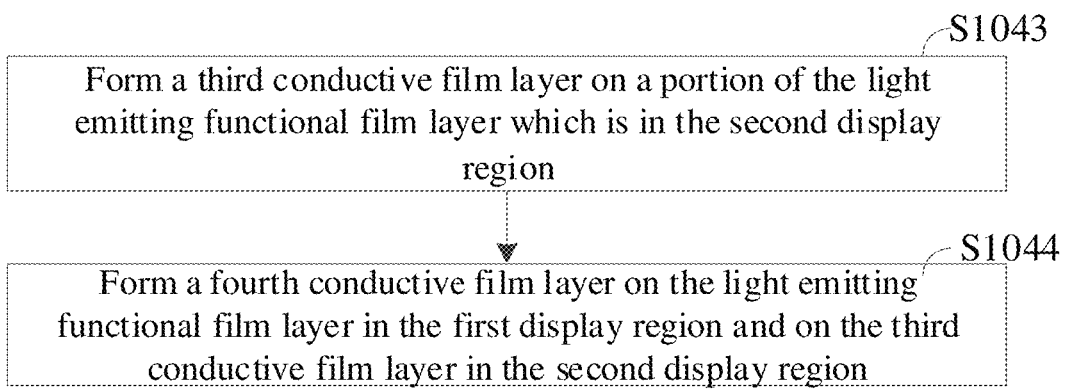
FIG. 21 is a flowchart of another method of forming a conductive layer on a light emitting functional film layer according to an embodiment of the present disclosure.

In another embodiment, as illustrated in FIG. 21, the step 104 of forming the conductive layer on the light emitting functional film layer may be completed by the following steps 1043 and 1044.

At step 1043, a third conductive film layer is formed on a portion of the light emitting functional film layer located in the second display region.

Figure 22:
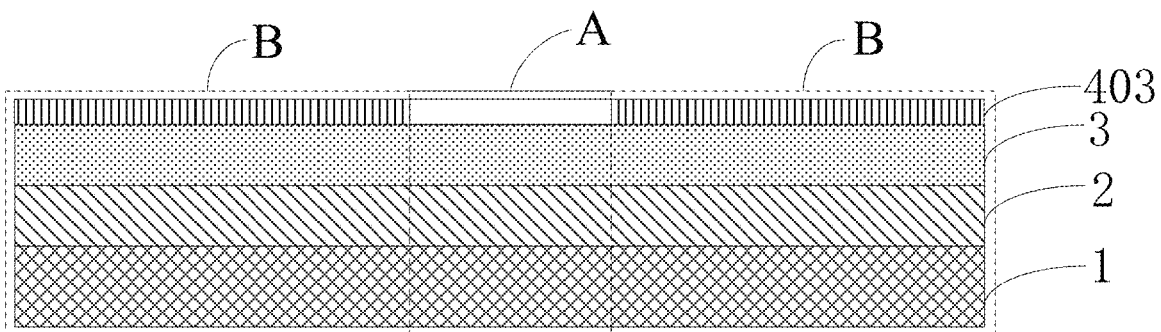
FIG. 22 is a schematic structural diagram of a sixth intermediate structure according to an embodiment of the present disclosure.

A sixth intermediate structure may be obtained through step 1043. FIG. 22 is a schematic structural diagram of the sixth intermediate structure. As illustrated in FIG. 22, the driving circuit layer 2 is formed on the base substrate 1, and the light emitting functional film layer 3 is formed on the driving circuit layer 2, where A denotes the first display region, and B denotes the second display region. The third conductive film layer 403 is formed on the light emitting functional film layer 3 and covers only the second display region B.

The third conductive film layer 403 may have the same thickness as the second conductive film layer 402, and the material of the third conductive film layer 403 may be the same as the material of the second conductive film layer 402, which includes at least one of Mg or Ag.

At step 1044, a fourth conductive film layer is formed on the light emitting functional film layer in the first display region and on the third conductive film layer in the second display region.

Figure 23:
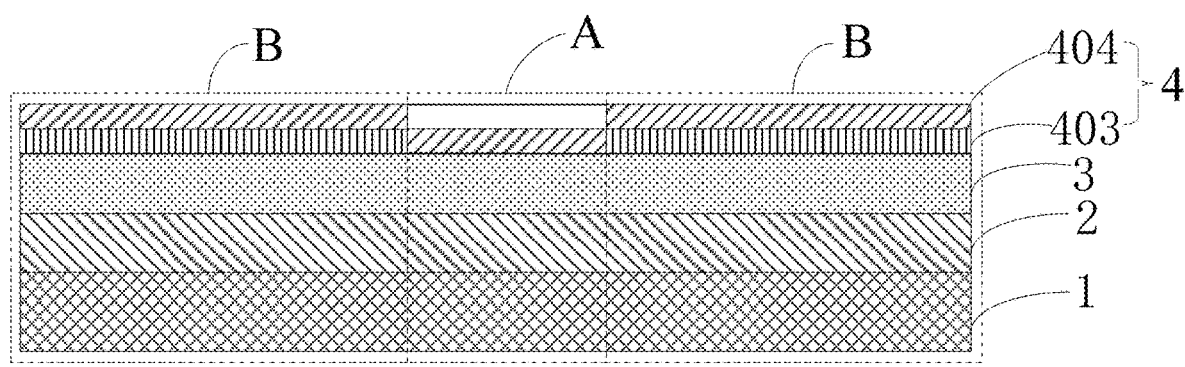
FIG. 23 is a schematic structural diagram of a seventh intermediate structure according to an embodiment of the present disclosure.

A seventh intermediate structure may be obtained through step 1044, and a schematic structural diagram of the seventh intermediate structure is illustrated in FIG. 23. As illustrated in FIG. 23, the fourth conductive film layer 404 covers the light emitting functional film layer 3 in the first display region A and the third conductive film layer 403 in the second display region B.

Therefore, in the conductive layer 4 obtained through steps 1043 and 1044, a part of the conductive layer 4 which is located in the first display region A only includes the fourth conductive film layer 404, and a part of the conductive layer 4 which is located in the second display region B includes the third conductive film layers 403 and the fourth conductive film layer 404.

The material of the fourth conductive film layer 404 may be indium tin oxide, indium zinc oxide, indium tin oxide doped with silver, or indium zinc oxide doped with silver. Alternatively, the material of the fourth conductive film layer 404 includes at least one of Mg or Ag. Preferably, the material of the third conductive film layer 403 includes both Mg and Ag, and the mass ratio of Mg to Ag ranges from 1:4 to 1:20. The thickness of the fourth conductive film layer 404 may be the same as the thickness of the first conductive film layer 401, and the material of the fourth conductive film layer 404 may be the same as the material of the first conductive film layer 401.

In the display panel manufactured by the manufacturing method according to the embodiments of the present disclosure, the thickness of the conductive layer located in the first display region is less than the thickness of the conductive layer located in the second display region, so that the light transmittance of the first display region is greater than the light transmittance of the second display region, thereby enabling the light sensing element disposed beneath the first display region to receive enough light to guarantee the light sensing element to operate properly.

Both the display panel manufactured by the above manufacturing method and the display panel 100 according to the above embodiment pertain to a same inventive concept. For details, reference may be made to the above embodiments of the display panel 100, details of which will not be elaborated herein.

Figure 24:
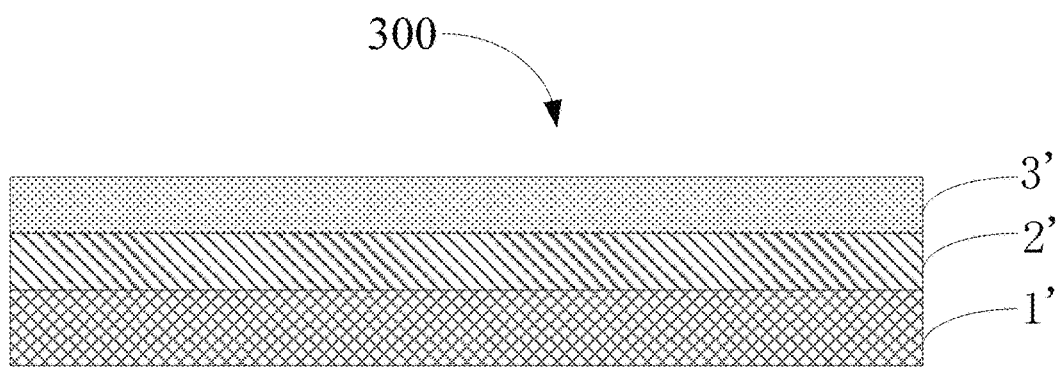
FIG. 24 is a schematic structural diagram of a transparent OLED substrate according to an embodiment of the present disclosure.
Figure 25:
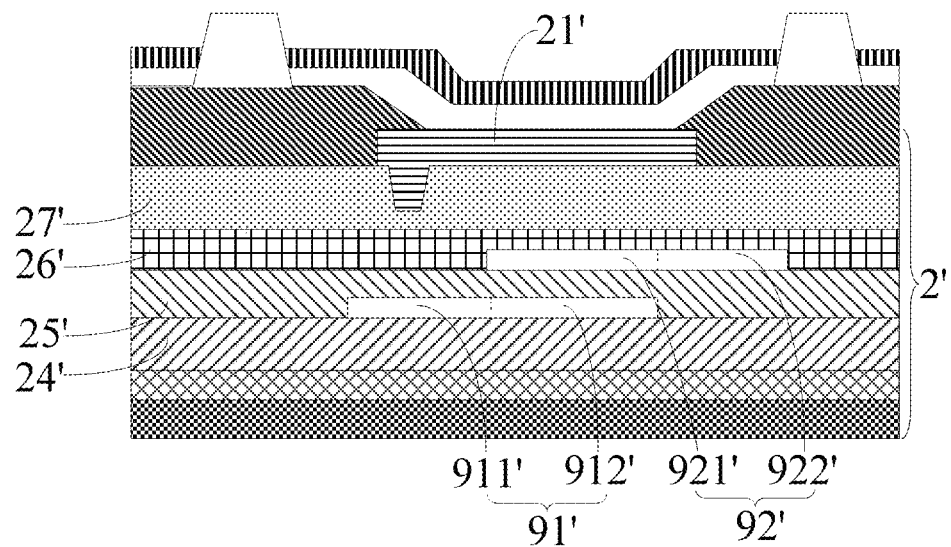
FIG. 25 is a cross-sectional view of a transparent OLED substrate according to an embodiment of the present disclosure.
Figure 26:
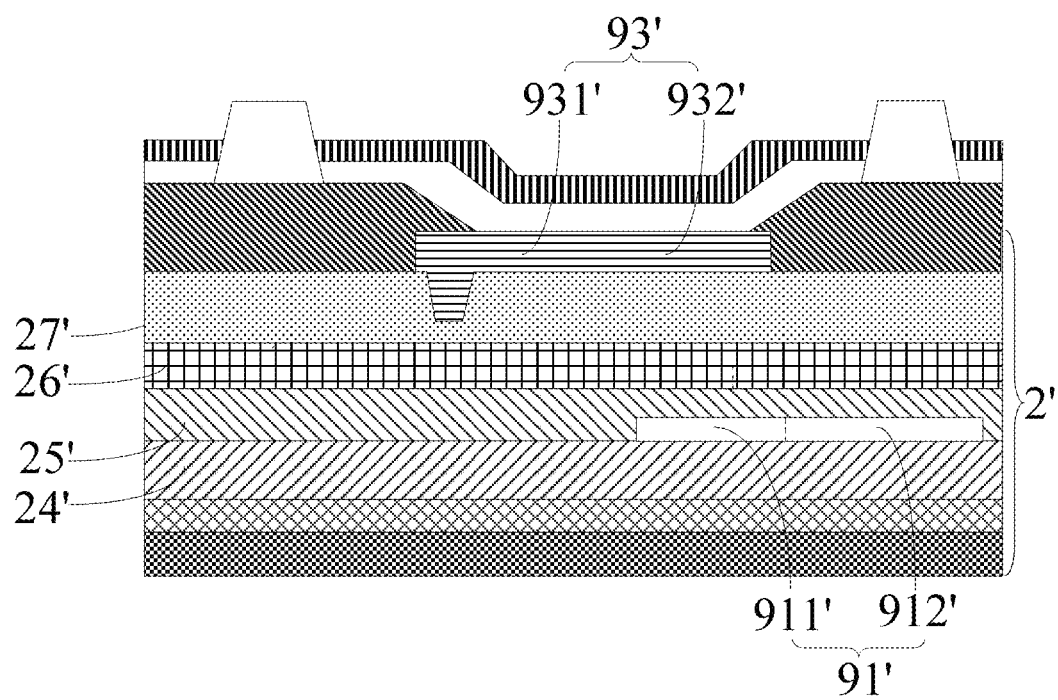
FIG. 26 is another cross-sectional view of a transparent OLED substrate according to an embodiment of the present disclosure.

Embodiments of the present disclosure further provide an array substrate including a transparent OLED substrate 300. As illustrated in FIG. 24, the transparent OLED substrate 300 or the transparent first OLED substrate includes a base substrate 1', a driving circuit layer 2' formed on the base substrate 1' and a light emitting functional film layer 3' formed on the driving circuit layer 2'. The driving circuit layer 2' includes a plurality of first driving circuit units. The first driving circuit unit includes a storage capacitor and a first transistor. And the storage capacitor includes a first electrode plate and a second electrode plate. Referring to FIGS. 25 and 26, the first driving circuit unit includes a first conductive layer 91', a part 912' of the first conductive layer 91' serves as the first electrode plate, and another part 911' thereof serves as the gate electrode of the first transistor.

In the transparent OLED substrate 300, since a part of the first conductive layer serves as the first electrode plate and another part serves as the gate electrode of the first transistor, the gate electrode of the first transistor, the first electrode plate of the storage capacitor as well as the connection therebetween may be completed through a single process step, and there is no need to manufacture the connection structure therebetween after the gate electrode of the first transistor and the first electrode plate of the storage capacitor are formed. The manufacturing process of the first driving circuit unit is simplified.

As illustrated in FIGS. 25 and 26, the driving circuit layer 2' of the transparent OLED substrate 300 includes a gate insulating layer 24', a capacitor insulating layer 25' on the gate insulating layer 24', an interlayer dielectric layer 26' on the capacitor insulating layer 25', and a planarization layer 27' on the interlayer dielectric layer 26'. The first conductive layer 91' is disposed between the gate insulating layer 24' and the capacitor insulating layer 25'.

The first driving circuit unit may be a 2T1C driving circuit. When the first driving circuit unit is a 2T1C driving circuit, the driving circuit layer of the transparent OLED substrate 300 may further include a power supply line, a data line, a scan line, and anode layers corresponding to the plurality of first driving circuit units in one-to-one manner. Referring to FIG. 25, the driving circuit layer of the transparent OLED substrate 300 further includes anode layers 21' on the planarization layer 27' and corresponding to the first driving circuit units in a one-to-one manner and second conductive layers 92'. A part 921' of the second conductive layer 92' serves as the second electrode plate of the storage capacitor, and another part 922' of the second conductive layer 92' serves as the power supply line. The first driving circuit unit further includes a second transistor. A source electrode of the first transistor is connected to the second conductive layer 92', a drain electrode of the first transistor is connected to a corresponding anode layer, a gate electrode of the second transistor is connected to the scan line, a drain electrode of the second transistor is connected to the first conductive layer respectively, and a source electrode of the second transistor is connected to the data line.

In addition to the first conductive layer 91', the second conductive layer 92', the anode layer 23', the gate insulating layer 24', the capacitor insulating layer 25', the interlayer dielectric layer 26' and the planarization layer 27' illustrated in FIG. 25, the driving circuit layer 2' of the transparent OLED substrate 300 further includes a data line, a scan line, source and drain electrodes of the first transistor, as well as gate, source and drain electrodes of the second transistor, which are not shown in FIG. 25.

When the first driving circuit unit is a 2T1C driving circuit, the circuit diagram is as illustrated in FIG. 7. The 2T1C structure of the first driving circuit unit of the first OLED substrate included in the array substrate is the same as the 2T1C structure of the first driving circuit unit of the display panel described above, which will not be repeated here.

The first transistor T1, the second transistor T2, the storage capacitor C, the data line, the scan line, and the anode layer are all made of transparent material. Preferably, the light transmittance of the transparent material is greater than or equal to 90%. Further, the transparent material is indium tin oxide, indium zinc oxide, indium tin oxide doped with silver or indium zinc oxide doped with silver. In this way, the light transmittance of the driving circuit layer of the transparent OLED substrate or the first OLED substrate included in the array substrate can be high, thereby further improving the light transmittance of the transparent OLED substrate or the first OLED substrate.

The first driving circuit unit may be a 3T1C driving circuit. When the first driving circuit unit is a 3T1C driving circuit, the driving circuit layer may include a power supply line, a data line, a first scan line, a second scan line, a reference potential line, and anode layers corresponding to a plurality of first driving circuit units in one-to-one manner. As illustrated in FIG. 26, the driving circuit layer 2' includes a third conductive layer 93' on the planarization layer 27', a part 932' of the third conductive layer 93' serves as the second electrode plate, and another part 931' of the third conductive layer 93' serves as the corresponding anode layer. With such an arrangement, the anode layer, the second electrode plate of the storage capacitor as well as the connection therebetween may be completed through a single process step, and there is no need to fabricate a connection therebetween after the anode layer and the second electrode plate of the storage capacitor are formed. The manufacturing process of the first driving circuit unit can be simplified.

In addition to the first conductive layer 91', the third conductive layer 93', the gate insulating layer 24', and the capacitor insulating layer 25', the interlayer dielectric layer 26' and the planarization layer 27' illustrated in FIG. 26, the driving circuit layer 2' of the transparent OLED substrate or the first OLED substrate further include a power supply line; a data line; a first scan line; a second scan line; a reference potential line; source and drain electrodes of the first transistor; gate, source and drain electrodes of the third transistor; as well as gate, source and drain electrodes of the fourth transistor, which are not shown in FIG. 26.

When the first driving circuit unit is a 3T1C driving circuit, the schematic circuit diagram is illustrated in FIG. 9. The 3T1C structure of the first driving circuit unit of the first OLED substrate included in the array substrate is the same as the 3T1C structure of the first driving circuit unit of the display panel described above, details of which will not be elaborated here.

Preferably, the first transistor T1, the third transistor T3, the fourth transistor T4, the storage capacitor C, the data line, the first scan line, the second scan line, the reference potential line and the anode layer are all made of transparent material. Preferably, the light transmittance of the transparent material is greater than or equal to 90%. Further, the transparent material is indium tin oxide, indium zinc oxide, indium tin oxide doped with silver or indium zinc oxide doped with silver. In this way, the light transmittance of the driving circuit layer in the transparent OLED substrate or the first OLED substrate of the array substrate can be high, thereby further improving the light transmittance of the transparent OLED substrate or the first OLED substrate.

The array substrate according to the embodiments of the present disclosure includes a first OLED substrate and a second OLED substrate. The first OLED substrate is a transparent OLED substrate, and the second OLED substrate is a non-transparent OLED substrate. The first OLED substrate and the second OLED substrate share the same base substrate 1, and the light emitting functional film layer of the first OLED substrate and the light emitting functional film layer of the second OLED substrate are formed through a single process.

In the array substrate according to the embodiment of the present disclosure, since a part of the first conductive layer of the first OLED substrate serves as the first electrode plate of the storage capacitor, and another part serves as the gate electrodes of the first transistor, the gate electrode of the first transistor, the first electrode plate of the storage capacitor and the connection therebetween may be completed in a single step, and there is no need to fabricate a connection structure therebetween after the gate electrode of the first transistor and the first electrode plate of the storage capacitor are formed. The manufacturing process of the first driving circuit unit can be simplified. The first OLED substrate (i.e., the above-mentioned transparent OLED substrate) and the second OLED substrate include: a base substrate; a driving circuit layer formed on the base substrate; and a light emitting functional film layer formed on the driving circuit layer.

The first OLED substrate of the array substrate may be at least partially surrounded by the second OLED substrate.

In one embodiment, the driving circuit layer of the second OLED substrate includes a plurality of second driving circuit units. The number of transistors included in the second driving circuit unit is greater than the number of transistors included in the first driving circuit unit. Optionally, the first driving circuit unit may be a 2T1C driving circuit (that is, the first driving circuit unit includes two transistors and one storage capacitor), or the first driving circuit unit may be a 3T1C driving circuit (that is, the first driving circuit unit includes three transistors and one storage capacitor). The second driving circuit unit may be, for example, a 7T1C circuit (that is, the second driving circuit unit includes seven transistors and one storage capacitor), a 5T1C circuit (that is, the second driving circuit unit includes five transistors and one storage capacitor), and a 4T1C circuit (that is, the second driving circuit unit includes four transistors and one storage capacitor). With such an arrangement, the structure of the first driving circuit unit is less complex than the structure of the second driving circuit unit, so that the area of the conductive layer of the driving circuit layer of the first OLED substrate is small, thereby improving the light transmittance of the first OLED substrate rate.

Embodiments of the present disclosure further provide a display screen including the array substrate mentioned above and an encapsulation structure. The encapsulation structure is disposed on the array substrate, and a light sensing element may be provided beneath the first OLED substrate of the array substrate.

In the display screen according to the embodiments of the present disclosure, since a part of the first conductive layer of the first OLED substrate serves as the first electrode plate of the storage capacitor, and another part serves as the gate electrode of the first transistor, the gate electrode of the first transistor, the first electrode plate of the storage capacitor as well as a connection therebetween may be completed in a single step, and there is no need to fabricate a connection structure therebetween after the gate electrode of the first transistor and the first electrode plate of the storage capacitor are formed. In this way, the manufacturing process of the first driving circuit unit can be simplified, thereby simplifying the manufacturing process of the driving circuit layer of the first OLED substrate.

An encapsulation layer may be a thin-film encapsulation structure, and the thin-film encapsulation structure may include a stack structure in which one or more organic layers and one or more inorganic layers are alternately laminated. Both the organic layers and the inorganic layers are made of transparent material. And the material of the inorganic layers is, for example, $SiO_2$, SiNx, $Al_2O_3$, etc. The material of the organic layers may be, for example, PI, PET, etc. The encapsulation layer may further be a glass cover or a glass frit encapsulation structure.

Embodiments of the present disclosure further provide a display device, which includes a device body and the display screen mentioned above. The device body includes a component region, and the display screen covers the device body. The component region is located beneath the first OLED substrate, and the component region is provided with a light sensing element that collects light through the first OLED substrate.

The light sensing element may include a camera and/or a light sensor. In the component region, other elements in addition to the light sensing element, such as a gyroscope or an earpiece, may further be provided.

The component region may be a notched region, and the first OLED substrate of the display screen may be arranged corresponding to the notched region, so that the light sensing element can collect external light through the first OLED substrate and perform other operations.

In the above display device, a part of the first conductive layer of the first OLED substrate serves as the first electrode plate of the storage capacitor, and another part serves as the gate electrode of the first transistor. The gate electrode of the first transistor, the first electrode plate of the storage capacitor as well as a connection therebetween may be completed through a single step, and there is no need to manufacture a connection structure therebetween after the gate electrode of the first transistor and the first electrode plate of the storage capacitor are formed. A manufacturing process of the first driving circuit unit can be simplified, thereby simplifying the manufacturing process of the driving circuit layer of the first OLED substrate.

The aforementioned electronic device such as a display device may be a digital device such as a mobile phone, a tablet PC, a palmtop computer, an ipad, or the like.

In the drawings, the size of layers and regions may be exaggerated for the sake of clear illustration. And it is understood that when an element or layer is referred to as "on" another element or layer, it can be directly on the another element or an intervening layer may exist. In addition, it can be understood that when an element or layer is referred to as "beneath" another element or layer, it can be directly beneath the another element, or more than one intervening layer or element may exist. In addition, it should be further understood that when a layer or element is referred to as "between" two layers or two elements, it can be the only layer between the two layers or two elements, or more than one intermediate layer or element may further exist. Similar reference signs designate similar elements throughout the description.

The invention claimed is:

1. A display panel, comprising a first display region and a second display region, the display panel further comprising:
   a base substrate;
   a driving circuit layer, formed on the base substrate;
   a light emitting functional film layer, formed on the driving circuit layer; and
   a conductive layer, formed on the light emitting functional film layer; wherein the base substrate, the driving circuit layer, the light emitting functional layer and the conductive layer are located in the first display region and the second display region, and a ratio of a thickness of a portion of the conductive layer located in the first display region to a thickness of a portion of the conductive layer located in the second display region ranges from 0.25:1 to 0.85:1.

2. The display panel according to claim 1, wherein
   a material of the portion of the conductive layer located in the first display region is one of the group of indium tin oxide, indium zinc oxide, indium tin oxide doped with silver, and indium zinc oxide doped with silver; or
   the material of the portion of the conductive layer located in the first display region comprises at least one of Mg or Ag.

3. The display panel according to claim 1, wherein
   the conductive layer is a cathode layer;
   the light emitting functional film layer comprises an organic light emitting material and an electron injection layer disposed between the organic light emitting material and the conductive layer, wherein a material of the electron injection layer comprises Ag, and further comprises at least one of Mg, K, Li or Cs; and a ratio of a mass of Ag in the electron injection layer to a total mass of the electron injection layer ranges from 1:5 to 1:21.

4. The display panel according to claim 1, wherein the thickness of the portion of the conductive layer located in the first display region ranges from 5 nm to 10 nm and the thickness of the portion of the conductive layer located in the second display region ranges from 12 nm to 20 nm.

5. The display panel according to claim 1, wherein the base substrate comprises a first base substrate which is located in the first display region and a second base substrate which is located in the second display region, wherein a light transmittance of the first base substrate is greater than a light transmittance of the second base substrate.

6. The display panel according to claim 5, wherein
the second base substrate has a stack structure in which one or more organic layers and one or more inorganic layers are alternately laminated, the first base substrate at least comprises a transparent material layer, and the first base substrate has a same thickness as the second base substrate.

7. The display panel according to claim 6, wherein
the first base substrate further comprises a stack structure in which one or more organic layers and one or more inorganic layers are alternately laminated, the stack structure of the first base substrate and the stack structure of the second base substrate share a part of a film layer.

8. The display panel according to claim 7, wherein
the stack structure of the first base substrate comprises a first organic layer and a first inorganic layer located on the first organic layer; the stack structure of the second base substrate comprises a second organic layer, a second inorganic layer, a third organic layer and a third inorganic layer sequentially and alternately laminated from bottom to top, the first organic layer and a part of the third organic layer are disposed in a same layer and formed of a same material, and the first inorganic layer and the third inorganic layer are disposed in a same layer and formed of a same material, wherein a thickness of the first organic layer is less than a thickness of the third organic layer, and a thickness of the first inorganic layer is equal to a thickness of the third inorganic layer; and
the transparent material layer of the first base substrate is disposed beneath the stack structure of the first base substrate, and a bottom surface of the transparent material layer of the first base substrate is flush with a bottom surface of the second base substrate.

9. The display panel according to claim 6, wherein
a light transmittance of the transparent material layer of the first base substrate is greater than 90%,
a material for the transparent material layer of the first base substrate comprises at least one of PET or PC, and
a light transmittance of the second base substrate ranges from 30% to 60%.

10. The display panel according to claim 7, wherein a protective layer is disposed beneath the first base substrate, beneath the second base substrate, between a side surface of the transparent material layer of the first base substrate and the second base substrate; and/or the protective layer is disposed between a top of the transparent material layer of the first base substrate and the stack structure of the first base substrate.

11. The display panel according to claim 1, wherein
a portion of the driving circuit layer located in the first display region comprises an anode layer; or
the portion of the driving circuit layer located in the first display region comprises an anode layer and a transparent organic material film layer disposed beneath the anode layer; or
the portion of the driving circuit layer located in the first display region comprises an anode layer and a plurality of insulating layers disposed beneath the anode layer.

12. The display panel according to claim 11, wherein
a portion of the driving circuit layer located in the second display region comprises a plurality of insulating layers, and a thickness of the transparent organic material film layer is the same as an overall thickness of the insulating layers in the second display region.

13. The display panel according to claim 1, wherein the first display region and the second display region are disposed as AMOLED display regions,
a portion of the driving circuit layer located in the first display region comprises a plurality of first driving circuit units, each of the first driving circuit units comprises a plurality of transistors and a storage capacitor, a portion of the driving circuit layer located in the second display region comprises a plurality of second driving circuit units, and each of the second driving circuit units comprises a plurality of transistors and a storage capacitor, wherein a number of the transistors in each of the first driving circuit units is less than a number of the transistors in each of the second driving circuit units.

14. The display panel according to claim 13, wherein
the transistors of each of the first driving circuit units comprise a first transistor, the storage capacitor of each of the first driving circuit units comprise a first electrode plate and a second electrode plate, and the portion of the driving circuit layer located in the first display region comprises a first conductive layer, wherein a part of the first conductive layer serves as the first electrode plate, and another part of the first conductive layer serves as a gate electrode of the first transistor,
the portion of the driving circuit layer located in the first display region further comprises a power supply line, a data line, a scan line, and a plurality of anode layers corresponding to the plurality of first driving circuit units in one-to-one manner; and the portion of the driving circuit layer located in the first display region further comprises a second conductive layer, a part of the second conductive layer serves as the second electrode plate, and another part of the second conductive layer serves as the power supply line; the transistors of the first driving circuit unit further comprise a second transistor, a source electrode of the first transistor is connected to the second conductive layer, a drain electrode of the first transistor is connected to a corresponding one of the anode layers, a gate electrode of the second transistor is connected to the scan line, a drain electrode of the second transistor is connected to the first conductive layer, and a source electrode of the second transistor is connected to the data line; and
the first transistor, the second transistor, the storage capacitor of the first driving circuit unit, the data line, the scan line, and the anode layers are made of transparent material.

15. The display panel according to claim 13, wherein
the portion of the driving circuit layer located in the first display region comprises a power supply line, a data line, a first scan line, a second scan line, a reference potential line, and a plurality of anode layers corresponding to the plurality of first driving circuit units in one-to-one manner;

the transistors of each of the first driving circuit units comprise a first transistor, the storage capacitor of each of the first driving circuit units comprise a first electrode plate and a second electrode plate, and the portion of the driving circuit layer located in the first display region comprises a first conductive layer and a third conductive layer; a part of the first conductive layer serves as the first electrode plate, another part of the first conductive layer serves as a gate electrode of the first transistor, a part of the third conductive layer serves as the second electrode plate, and another part of the third conductive layer serves as an anode layer; the transistors of each of the first driving circuit units further comprise a third transistor and a fourth transistor, a source electrode of the third transistor is connected to the data line, a gate electrode of the third transistor is connected to the first scan line, a drain electrode of the third transistor is connected to the first conductive layer, a drain electrode of the first transistor is connected to the power supply line, and a source electrode of the first transistor is connected to the third conductive layer, a gate electrode of the fourth transistor is connected to the second scan line, a source electrode of the fourth transistor is connected to the reference potential line, and a drain electrode of the fourth transistor is connected to the third conductive layer; and the first transistor, the third transistor, the fourth transistor, the storage capacitor of the first driving circuit unit, the data line, the first scan line, the second scan line, the reference potential line and the anode layers are made of transparent material.

16. A display device, comprising:
a device body comprising a component region; and
the display panel according to claim 1 covering on the device body;
wherein the component region is located beneath the first display region, and the component region is provided with one or more light sensing elements which collect light through the first display region.

17. A method of manufacturing a display panel, the display panel comprising a first display region and a second display region, the method comprising:
forming a base substrate;
forming a driving circuit layer on the base substrate;
forming a light emitting functional film layer on the driving circuit layer; and
forming a conductive layer on the light emitting functional film layer, wherein a ratio of a thickness of a portion of the conductive layer located in the first display region to a thickness of a portion of the conductive layer located in the second display region ranges from 0.25:1 to 0.85:1.

18. The method according to claim 17, wherein the forming the conductive layer on the light emitting functional film layer further comprises:
forming a first conductive film layer on the light emitting functional film layer, the first conductive film layer covers the first display region and the second display region; and
forming a second conductive film on the first conductive film layer, and the second conductive film layer is provided in the second display region; or,
forming a third conductive film layer on a portion of the light emitting functional film layer located in the second display region; and
forming a fourth conductive film layer on a portion of the light emitting functional film layer located in the first display region and on the third conductive film layer in the second display region.

19. The method according to claim 17, wherein the forming the base substrate further comprises:
forming a base substrate layer;
forming a groove at a position of the base substrate layer corresponding to the first display region; and
forming a transparent material layer in the groove.

20. The method according to claim 19, wherein forming the base substrate layer further comprises:
forming a stack structure in which one or more organic layers and one or more inorganic layers are alternately laminated;
before forming the transparent material layer in the groove, the method further comprises:
forming a plurality of protective layers on the inner surface of the groove and beneath the base substrate layer;
after forming the transparent material layer in the groove, the method further comprises:
forming a protective layer beneath the transparent material layer and the base substrate layer.

* * * * *